United States Patent
Hwang et al.

(10) Patent No.: US 9,601,420 B2
(45) Date of Patent: Mar. 21, 2017

(54) SEMICONDUCTOR DEVICE AND METHOD OF MANUFACTURING THE SAME

(71) Applicants: Yoo-Sang Hwang, Suwon-si (KR); Hyun-Woo Chung, Yongin-si (KR); Dae-Ik Kim, Hwaseong-si (KR)

(72) Inventors: Yoo-Sang Hwang, Suwon-si (KR); Hyun-Woo Chung, Yongin-si (KR); Dae-Ik Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 207 days.

(21) Appl. No.: 14/018,709

(22) Filed: Sep. 5, 2013

(65) Prior Publication Data

US 2014/0061736 A1 Mar. 6, 2014

(30) Foreign Application Priority Data

Sep. 6, 2012 (KR) ........................ 10-2012-0098852

(51) Int. Cl.
*H01L 21/768* (2006.01)
*H01L 23/498* (2006.01)
(Continued)

(52) U.S. Cl.
CPC .... *H01L 23/49811* (2013.01); *H01L 21/7682* (2013.01); *H01L 21/76229* (2013.01); *H01L 21/76885* (2013.01); *H01L 21/76897* (2013.01); *H01L 23/522* (2013.01); *H01L 23/5222* (2013.01); *H01L 23/53295* (2013.01); *H01L 27/10885* (2013.01); *H01L 2924/0002* (2013.01)

(58) Field of Classification Search
None
See application file for complete search history.

(56) References Cited

U.S. PATENT DOCUMENTS 7,030,005 B2  4/2006  Lee
7,892,966 B2  2/2011  Won et al.
(Continued)

FOREIGN PATENT DOCUMENTS

JP  1997027545  1/1997
JP  2007188919  7/2007
(Continued)

*Primary Examiner* — Yu Chen
*Assistant Examiner* — Nilufa Rahim
(74) *Attorney, Agent, or Firm* — Volentine & Whitt, PLLC

(57) ABSTRACT

A semiconductor device includes a stack structure of a conductive line and an insulating capping line extending in a first direction on a substrate, a plurality of contact plugs arranged in a row along the first direction and having sidewall surfaces facing the conductive line with air spaces between the sidewall surfaces and the conductive line, and a support interposed between the insulating capping line and the contact plugs to limit the height of the air spaces. The width of the support varies or the support is present only intermittently in the first direction. In a method of manufacturing the semiconductor devices, a sacrificial spacer is formed on the side of the stack structure, the spacer is recessed, a support layer is formed in the recess, the support layer is etched to form the support, and then the remainder of the spacer is removed to provide the air spaces.

20 Claims, 37 Drawing Sheets

B - B'

(51) Int. Cl.
  *H01L 23/522*  (2006.01)
  *H01L 27/108*  (2006.01)
  *H01L 23/532*  (2006.01)
  *H01L 21/762*  (2006.01)

(56) References Cited

U.S. PATENT DOCUMENTS

| | | |
|---|---|---|
| 8,084,352 B2 | 12/2011 | Harada et al. |
| 2010/0285662 A1* | 11/2010 | Kim .................... H01L 21/7682 438/675 |
| 2011/0309430 A1 | 12/2011 | Purayath et al. |
| 2012/0091587 A1* | 4/2012 | Or-Bach et al. .............. 257/741 |
| 2012/0126306 A1* | 5/2012 | Kawaguchi ........... H01L 21/764 257/319 |
| 2012/0238099 A1* | 9/2012 | Shundo ............... H01L 21/7682 438/703 |
| 2012/0276711 A1* | 11/2012 | Yoon et al. ................... 438/421 |

FOREIGN PATENT DOCUMENTS

| | | |
|---|---|---|
| JP | 2009016790 | 1/2009 |
| KR | 20010011638 A | 2/2001 |
| KR | 20040002234 A | 1/2004 |
| KR | 0552856 A | 10/2005 |
| KR | 0843233 B1 | 6/2008 |

* cited by examiner

B - B'

C - C'

B – B'

C – C'

B - B'

B - B'

C - C

B – B'

B - B'

C - C'

B - B'

C - C'

B - B'

C - C'

B - B'

C - C'

B - B'

C - C'

B - B'

C - C'

B - B'

C - C'

B - B'

C - C'

B – B'

C – C'

B - B'

C - C'

B - B'

C - C'

B – B'

C – C'

B - B'

C - C'

B - B'

C - C'

B - B'

C - C'

B – B'

C – C'

B - B'

C - C'

B – B'

C – C'

B - B'

C - C'

B - B'

C - C'

B - B'

C - C'

B – B'

C – C'

B – B'

C – C'

SEMICONDUCTOR DEVICE AND METHOD OF MANUFACTURING THE SAME

PRIORITY STATEMENT

This application claims the benefit of Korean Patent Application No. 10-2012-0098852, filed on Sep. 6, 2012, in the Korean Intellectual Property Office, the disclosure of which is hereby incorporated by reference in its entirety.

BACKGROUND

The inventive concept relates to a semiconductor device and to a method of manufacturing the same. More particularly, the inventive concept relates to a semiconductor device including a plurality of conductive lines disposed adjacent to one another and buried contacts adjacent the conductive lines, and to a method of manufacturing the same. For example, the inventive concept relates to a semiconductor device including a plurality of bit lines and contact plugs juxtaposed with the bit lines, and to a method of manufacturing the same.

An increase in the integration density of semiconductor devices has led to a reduction in the design rules of elements of semiconductor devices. In meeting these design rules, the features of semiconductor devices are becoming smaller, and the distances between interconnection lines and contact plugs interposed therebetween are gradually becoming shorter. As a result, load capacitances between adjacent conductive patterns are increasing. High load capacitances may adversely affect an operating speed or refresh characteristics of the device.

SUMMARY

According to an aspect of the inventive concept, there is provided a semiconductor device comprising a substrate, a linear stack structure disposed on the substrate, extending longitudinally in a first direction on the substrate, and including a conductive line and an insulating capping line disposed on the conductive line, a plurality of contact plugs arranged in a row in the first direction and having respective sidewall surfaces facing the conductive line with air spaces between the sidewall surfaces and the conductive line, respectively, and a support interposed between the insulating capping line and the plurality of contact plugs. The support is disposed over the tops of the air spaces and may delimit the tops of the air spaces. Also, the width of the support in a second direction orthogonal to the first direction varies along the first direction or the support is discontinuous in the first direction.

According to another aspect of the inventive concept, there is provided a semiconductor device comprising a substrate having a plurality of active regions, a linear stack structure including a bit line and an insulating capping line disposed on the bit line and which extends longitudinally on the substrate across the plurality of active regions in a first direction, a contact plug contacting one of the active regions and having sidewall surfaces facing the bit line with air spaces between the sidewall surfaces and the bit line, respectively, and a support having a bottom surface exposed by the air spaces and opposite sidewall surfaces facing the insulating capping line and the contact plug, respectively. The width of the support in a second direction orthogonal to the first direction varies along the first direction or the support is discontinuous in the first direction.

According to still another aspect of the inventive concept, there is provided semiconductor device comprising a substrate having active regions, bit lines disposed on the substrate, extending parallel to each other in a first direction, and electrically connected to the active regions, a respective row of contact plugs interposed between adjacent ones of the bit lines of each respective pair thereof, capacitors disposed on and electrically connected to the contact plugs such that the contact plugs electrically connect the capacitors to the active regions of the substrate, and supports that support upper portions of the contact plugs. Each of the contact plugs has opposite sidewall surfaces facing the bit lines between which the contact plug is disposed with air spaces existing between the sidewall surfaces and the bit lines, respectively. Also, each of the contact plugs is electrically connected to one of the active regions of the substrate. The supports top the air spaces, i.e., are disposed over or delimit tops of the air spaces.

According to another aspect of the inventive concept, there is provided a method of manufacturing a semiconductor device, in which a pair of linear stack structures are formed on a substrate, each stack structure extending longitudinally in a first direction and including a conductive line and an insulating capping line disposed on the conductive line, sacrificial spacers are formed on opposite sides of each of the stack structures and such that a first space is left between the pair of stack structures, a second conductive line is formed in the first space such that the second conductive line extends in the first direction, a recess is formed between the stack structures and the second conductive line by removing portions of the sacrificial spacers, a support layer is formed in the recess, a plurality of contact plugs are formed in a row in the first direction by patterning the second conductive line, supports are formed by removing an exposed portion of the support layers such that the width of each of the supports in a second direction orthogonal to the first direction varies along the first direction or each of the supports is discontinuous in the first direction, and air spaces are formed between the conductive lines and the contact plugs by removing the remaining portions of the sacrificial spacers.

According to another aspect of the inventive concept, there is provided a method of manufacturing a semiconductor device. The method includes forming a pair of stack structures on a substrate. Each of the stack structures includes a conductive line and an insulating capping line extending in a first direction. Sacrificial spacers are formed on sidewalls of each of the pair of stack structures to leave a first space between the pair of stack structures. A second conductive line is formed in the first space. The second conductive line extends in the first direction. Portions of the sacrificial spacers are removed to form a recess between the stack structure and the second conductive line. A support layer is formed in the recess. The second conductive lines are patterned to form a plurality of contact plugs arranged in a row along the first direction. An exposed surface of the support layer is partially removed to form a support having a variable width according to a position in the first direction. The remaining portions of the sacrificial spacers are removed to form air spacers between the first conductive lines and the plurality of contact plugs.

According to another aspect of the inventive concept, there is provided a method of manufacturing a semiconductor device, in which a pair of bit line stack structures are formed on a substrate having a plurality of active regions, each bit line stack structure including a bit line and an insulating capping line disposed on the bit line, and each bit line stack structure extending across the plurality of active regions, an insulating liner is formed on a top surfaces and opposing sidewall surfaces of the bit line stack structures, sacrificial spacers are formed covering the insulating liner on the opposing sidewall surfaces of the bit line stack structures and while leaving a first space exposing the plurality of active regions between the bit line stack structures, a conductive (contact plug-forming) line is formed in the first space such that opposite sidewall surfaces of the conductive line face the bit lines, respectively, portions of the sacrificial spacers are removed to form a recess between the bit line stack structures and the conductive line, a support layer is formed in the recess, parts of the (contact plug-forming) conductive line is removed to form a plurality of contact plugs in contact with the plurality of active regions and to thereby expose the sacrificial spacers, parts of the support layer that are located between the contact plugs are removed to form supports and such that width of each of the supports in a second direction orthogonal to the first direction varies along the first direction or each of the supports is discontinuous in the first direction, and the remaining portions of the sacrificial spacers are removed to form air spaces between the bit line stack structures and the contact plugs.

BRIEF DESCRIPTION OF THE DRAWINGS

The inventive concept will be more clearly understood from the following detailed description of preferred embodiments thereof made in conjunction with the accompanying drawings in which.

DETAILED DESCRIPTION OF THE EMBODIMENTS

Figure 1:
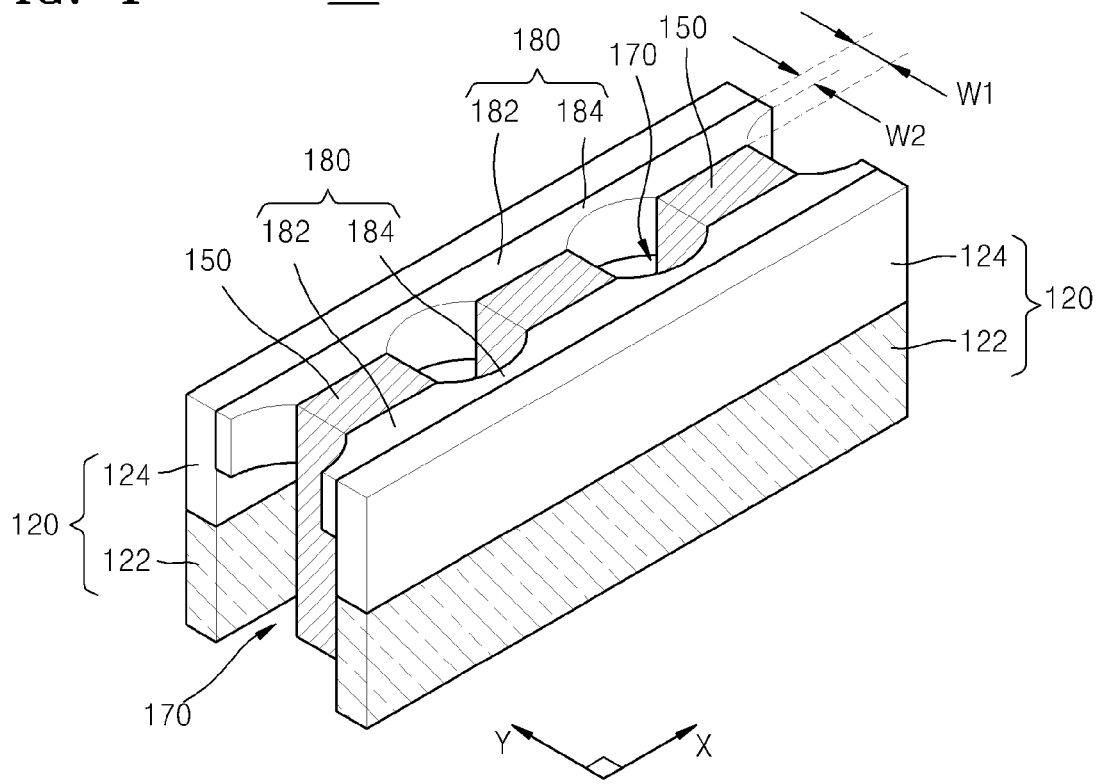
FIG. 1 is a perspective view of one form of a conductive structure that can be employed by a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Also, terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The term "extending" will generally be referring to the lengthwise direction of a feature having a line-shaped or elongated form. Also, shapes when described will be most often referring to sectional shapes taken in a plane parallel to the substrate, i.e., a horizontal plane in the orientations depicted in the figures.

A semiconductor device 100 according to the inventive concept will now be described in detail with reference to FIG. 1.

The semiconductor device 100 includes a plurality of stack structures 120 extending lengthwise in a first direction (X direction in FIG. 1). Each of the stack structures 120 may include a conductive line 122 and an insulating capping line 124 stacked on the conductive line 122.

A plurality of contact plugs 150 are arranged in a row along the first direction between two adjacent stack structures 120. Each of the contact plugs 150 may have a sidewall surface (referred to merely as the sidewall hereinafter) that faces a corresponding one of the conductive lines 122 across an air space 170. Thus, both sidewalls of each of the contact plugs 150 may be exposed by the air spaces 170.

Supports 180 are interposed between the insulating capping lines 124 and the plurality of contact plugs 150. Each of the supports 180 may extend continuously over the entire length of the stack structures 120, i.e., in the first direction. Each of the supports 180 may include a plurality of first support portions 182 which face sidewalls of the contact plugs 150, respectively, and a plurality of second support portions 184 which do not face any of the sidewalls of the contact plugs 150. The supports 180 thus limit the heights of the air spaces 170.

Also, the width W1 of the first support portions 182 (dimension in a second direction perpendicular to the first direction or the Y direction in FIG. 1) is greater than the width W2 of the second support portions 184.

In the illustrated example of this embodiment, the contact plugs 150 are spaced from one another at regular intervals along the first direction (along with the corresponding first support portions 182). However, the contact plugs 150 (along with corresponding first support portions 182) may be spaced at varying distances from each other in the first direction. For example, the contact plugs 150 (and the corresponding first support portions 182) may be spaced apart from each other by alternating relatively short first and long second distances in the first direction.

Preferably, the supports 180 are of at least one material selected from the group consisting of silicon nitride (SiN), silicon carbon nitride (SiCN), silicon oxide carbide (SiOC), silicon oxynitride (SiON), silicon oxide carbon nitride (SiOCN), titanium oxide (TiO), tantalum oxide (TaO), tantalum titanium oxide (TaTiO), tantalum silicon oxide (TaSiO), and aluminum oxide (AlO).

Figure 2:
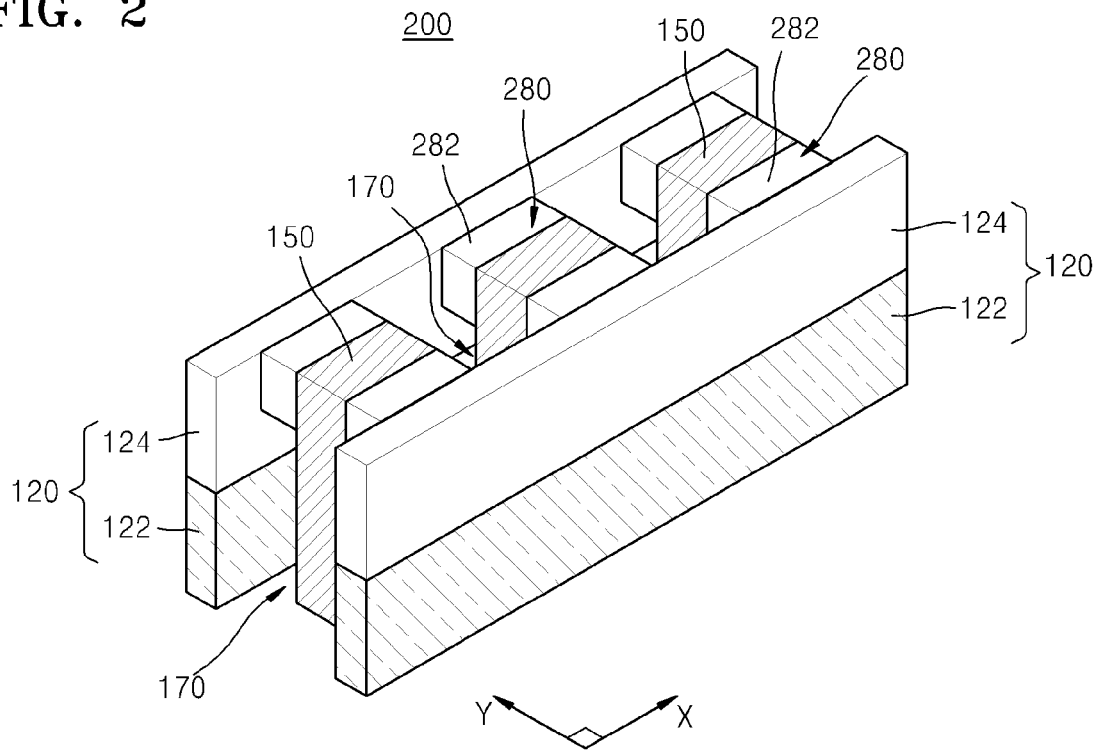
FIG. 2 is a perspective view of another form of a conductive structure that can be employed by a semiconductor device according to the inventive concept.

Another embodiment of a semiconductor device 200 according to the inventive concept will now be described in detail with reference to FIG. 2.

In the semiconductor device 200, supports 280 are interposed between insulating capping lines 124 of the stack structures 120 and the contact plugs 150. Thus, as in the first embodiment, the supports 280 limit the height of air spaces 170. However, in this embodiment, each of the supports 280 is discontinuous over the entire length of the stack structures 120, i.e., in the first direction. Thus, each of the supports 280 includes a plurality of spaced apart and discrete support pieces 282 facing sidewalls of the contact plugs 150, respectively. Furthermore, although FIG. 2 shows the supports pieces 282 as having a regular spacing in the first direction, the spacing between adjacent ones of the support pieces 282 of each of the supports 280 may vary in the first direction.

A semiconductor device 300 according to the inventive concept will now be described with reference to FIGS. 3A-3C. The semiconductor device 300 of this example is a semiconductor memory device. The memory cells of the cell array of the device may have a unit cell size of 6 $F^2$. Here, F refers to the minimum lithographic feature size.

Referring to FIGS. 3A through 3D, the semiconductor device 300 includes a substrate 310 in which a plurality of active regions 306 are defined by isolation regions 302. The substrate 310 may comprise silicon (Si), for example, monocrystalline Si, polycrystalline Si (poly-Si), or amorphous Si (a-Si). The substrate 310 may comprise germanium (Ge) or a semiconductor compound, such as silicon germanium (SiGe), silicon carbide (SiC), gallium arsenide (GaAs), indium arsenide (InAs), or indium phosphide (InP). The substrate 310 may also comprise a conductive region, for example, a doped well or doped structure.

A plurality of bit line stack structures 320 extend parallel to one another in a first direction (X direction in FIG. 3A) on the substrate 310. The bit line stack structures 320 may include a plurality of bit lines 322 and a plurality of insulating capping lines 324 covering the plurality of bit lines 322. The insulating capping lines 324 may be thicker than the bit lines 322.

The plurality of bit lines 322 may include at least one material selected from the group consisting of a doped semiconductor, a metal, a metal nitride, and a metal silicide. For example, each of the bit lines 322 may have a stacked structure in which doped polysilicon, tungsten nitride, and tungsten are stacked sequentially in this order. The plurality insulating capping lines 324 may each comprise a silicon nitride layer.

A plurality of word lines 330 are buried in the substrate 310. The word lines 330 may include at least one material selected from the group consisting of Ti, TiN, Ta, TaN, W, WN, TiSiN, and WSiN.

The word lines 330 may each extend across the direction in which the bit lines 322 extend. In particular, the word lines 330 may extend in the substrate 310 in a second direction (or Y direction in FIG. 3A) perpendicular to the first direction. The word lines 330 may also be spaced at regular intervals in the first direction. A top surface 330T (refer to FIG. 3C) of each of the word lines 330 may be disposed at a level beneath that of the top surface 310T (refer to FIG. 3B) of the substrate 310. A bottom surface 330B of each of the plurality of word lines 330 may have an uneven shape, and saddle FINFETs may be formed as the plurality of active regions 306.

Among the plurality of active regions 306, a plurality of active regions 306 are spaced from each other in a row in the first direction, and these active regions 306 extend parallel to one another and are aligned with a respective bit line 322. Also, among the plurality of active regions 306, two active regions 306 disposed adjacent to each other in the second direction are offset from one another by a predetermined distance in their longitudinal directions while still remaining parallel, i.e., are misaligned with each other.

A gate dielectric 332 may be interposed between the active regions 306 and the word lines 330. The gate dielectric 332 may include at least one layer selected from the group consisting of a silicon oxide layer, a silicon nitride layer, a silicon oxynitride layer, an oxide/nitride/oxide (ONO) layer, and a high-k dielectric layer (material having a higher dielectric constant than a silicon oxide). For example, the gate dielectric 332 may have a dielectric constant of about 10 to about 25. For instance, the gate dielectric 332 may include at least one material selected from the group consisting of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). Preferably, the gate dielectric layer 332 comprises a layer of hafnium oxide ($HfO_2$), aluminum oxide ($Al_2O_3$), hafnium aluminum oxide ($HfAlO_3$), tantalum oxide ($Ta_2O_3$), or titanium oxide ($TiO_2$).

Each of the plurality of word lines 330 may be covered with a buried insulating layer 334. A top surface 334T (refer to FIG. 3C) of the buried insulating layer 334 may be disposed at about the same level as the top surface 310T (refer to FIG. 3B) of the substrate 310. The buried insulating layer 334 may be a silicon oxide layer, a silicon nitride layer, or a silicon oxynitride layer or instead may be a multi-layered structure of such materials.

The sidewalls of each of the bit line stack structures 320 may be covered with insulating liners 328. The insulating liners 328 may comprise a silicon nitride layer.

Each of the bit lines 322 may be connected to the active regions 306 through a direct contact (DC) 342 extending through a first interlayer insulating layer 340.

In one example of this embodiment, the bit lines 322 have a pitch of 3 F and the word lines 330 have a pitch of 2 F.

A plurality of contact plugs 350 are arranged in a row in the first direction (X direction in FIG. 3A) between adjacent ones of each pair of bit line stack structures 320.

A plurality of capacitors 360 may be disposed on the plurality of contact plugs 350, respectively. Each of the capacitors 360 may include a lower electrode 362, a dielectric layer 364, and an upper electrode 366. Accordingly, the plurality of contact plugs 350 may constitute a plurality of buried contacts (BCs) that electrically connect the lower electrodes 362 of the plurality of capacitors 360 with the active regions 306 of the substrate 310. To this end, the contact plugs 350 may be formed of a metal, a metal silicide, a metal nitride, or a combination of such materials.

Each of the contact plugs 350 has a sidewall SW1 confronting a respective one of the bit lines 322 across an air space 370. A portion of the sidewall SW1 and a portion of the insulating liner 328 (refer to FIG. 3B) may be exposed by the air space 370. The air spaces 370 are collectively located above the substrate 310 by a distance at least equal to the thickness of the insulating liner 328.

Figure 3A:
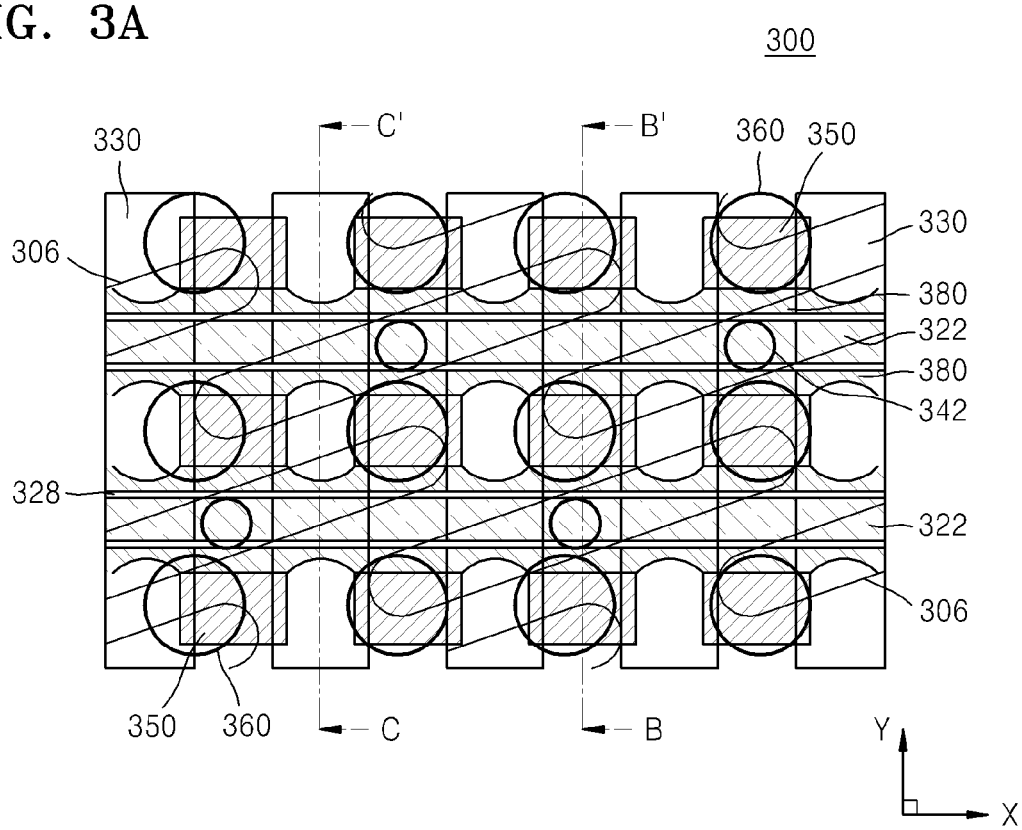
FIG. 3A is a diagram of the layout of a semiconductor device according to the inventive concept.

Furthermore, air gaps 372 may be provided between contact plugs 350 adjacent one another in the second direction (Y direction in FIG. 3A). Portions of the contact plugs 350 may be exposed by the air gaps 372. Also, air spaces 370 may communicate with the air gaps 372.

A plurality of supports 380 are interposed between the bit line stack structures 320 and the contact plugs 350. In this respect, the supports 380 may be interposed between the insulating capping lines 324 of the bit line stack structures 320 and the contact plugs 350. Thus, the height of the air spaces 370 may be limited by the supports 380 to H1 as shown in FIG. 3B wherein H1 is less than the height (or thickness) of the stack structures 32.

The supports 380 may be formed of SiN, SiCN, SiOC, SiON, SiOCN, a metal oxide, or a combination of such materials. Examples of suitable metal oxides are TiO, TaO, TaTiO, TaSiO, and AlO. Also, the supports 380 may consist of a single layer of material or 380 may have multi-layered structures including a plurality of support layers of different materials.

A second interlayer insulating layer 390 may be disposed on the bit line stack structures 320 and the supports 380. In this case, the second interlayer insulating layer 390 limits the heights of the air gaps 372 to H2 as shown in FIG. 3C. Portions of the contact plugs 350, insulating liners 328, and supports 380 may be exposed by the air gaps 372.

Figure 3B:
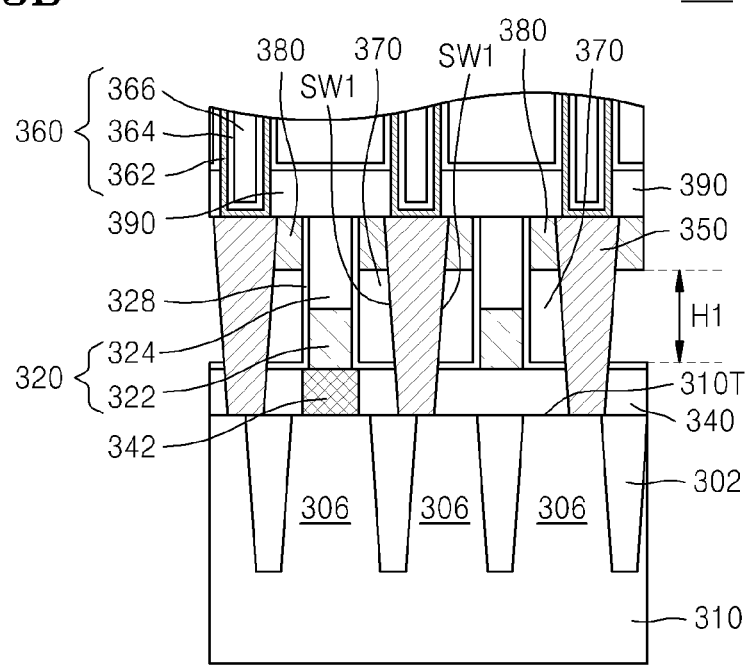
FIG. 3B is a cross-sectional view taken along line B-B' of FIG. 3A.
Figure 3C:
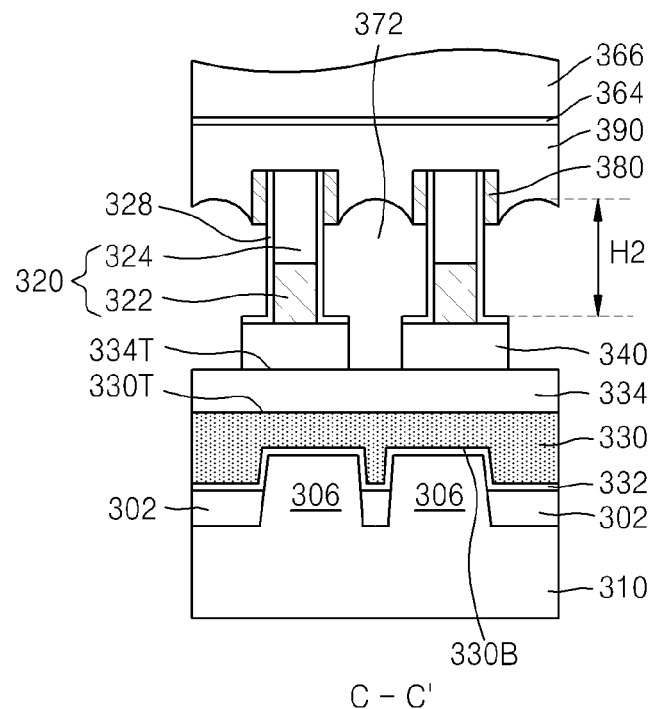
FIG. 3C is a cross-sectional view taken along line C-C' of FIG. 3A.
Figure 3D:
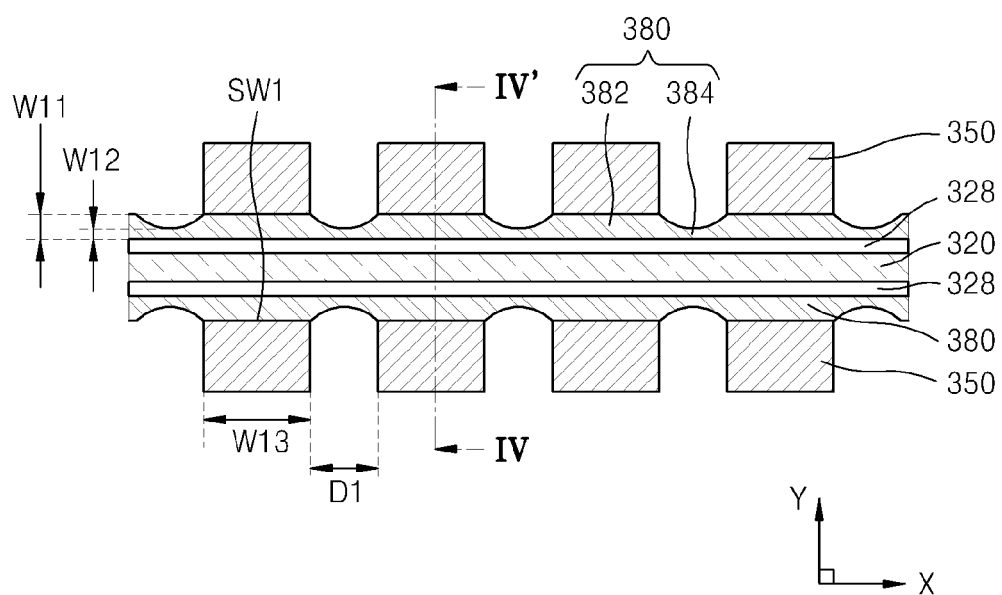
FIG. 3D is a plan view of a conductive structure of the semiconductor device of FIGS. 3A-3C.

Referring to FIG. 3D, each support 380 in this embodiment extends continuously over the entire length of the bit line stack structures 320 in the first direction (X direction in FIGS. 3A and 3D), and has a width that varies along the first direction. Moreover, each support 380 may contact sidewalls SW1 of a plurality of contact plugs 350. More specifically, each support 380 may include a plurality of first support portions 382 facing and disposed in contact with sidewalls SW1 of a plurality of contact plugs 350, and a plurality of second support portions 384 that do not face the sidewalls SW1. The second support portions 384 may have uniform shapes. Also, the width W11 of the first support portions 382 (dimension in the second or Y direction in FIGS. 3A and 3D) is greater than the width W12 of the second support portions 384. Also, the maximum width of the support 380 may be the width W11 of the first support portions 382.

The contact plugs 350 may have a uniform width W13 (in this case, their dimension in the first or X direction in FIGS. 3A and 3D). The plurality of contact plugs 350 may also be spaced from one another at regular intervals D1 in the first direction. In this case, the plurality of second support portions 384 of the supports 380 are spaced apart from one another by regular intervals corresponding to the width W13.

In the semiconductor device 300 shown in FIGS. 3A through 3D, as has already been described above, air space 370 is provided between the bit lines 322 and the contact plugs 350, and air gaps 372 are formed between the respective contact plugs 350. In this embodiment, the second support portions 384 of the supports 380 are relatively narrow so that upper portions of the air gaps 372 are relatively wide. Thus, the dielectric constants between the bit lines 322 and the contact plugs 350 may be relatively low, such that capacitance between adjacent conductive lines is correspondingly low.

Figure 4A:
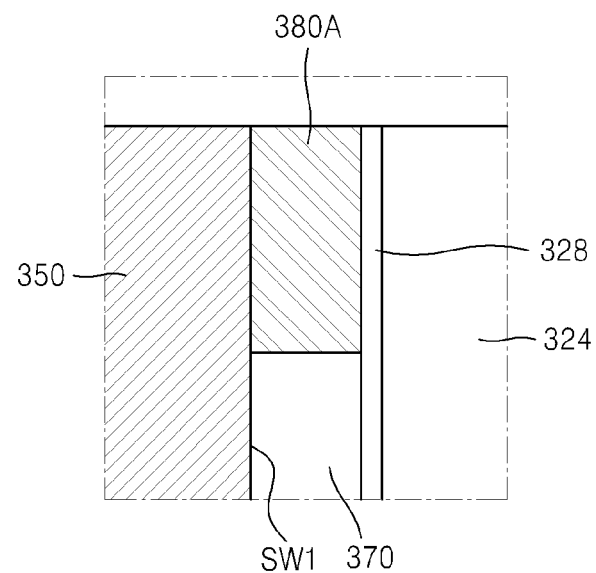
FIGS. 4A and 4B are each a cross-sectional view of part of a conductive structure of semiconductor devices according to the inventive concept.
Figure 4B:
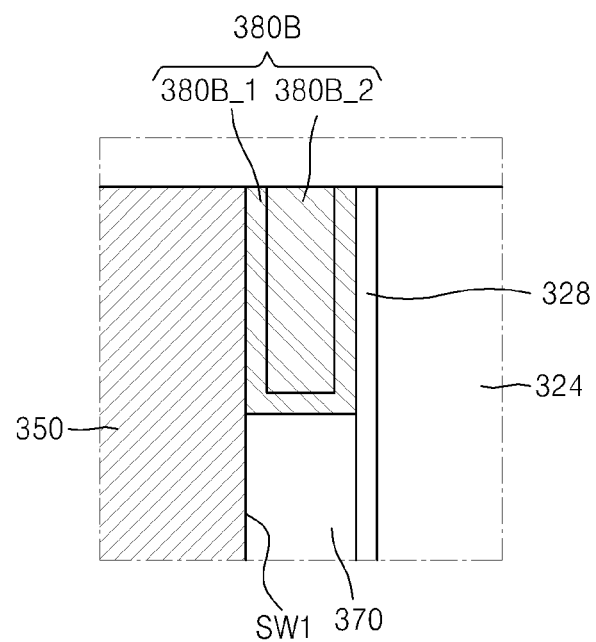

FIGS. 4A and 4B show different versions of supports 380A and 380B that may be employed in the semiconductor device 300 shown in FIGS. 3A through 3D.

Referring to FIG. 4A, the support 380A consists of a single layer of a silicon nitride, silicon oxynitride, or metal oxide. For example, the support 380A may consist of a single layer of material selected from the group consisting of silicon nitride (SiN), silicon carbon nitride (SiCN), silicon oxycarbide (SiOC), silicon oxynitride (SiON), carbon-doped silicon oxynitride (SiOCN), titanium oxide (TiO), tantalum oxide (TaO), tantalum titanium oxide (TaTiO), tantalum silicon oxide (TaSiO), and aluminum oxide (AlO).

In the example shown in FIG. 4B, the support 380B has a multi-layered structure including a first support layer 380B_1 and a second support layer 380B_2 formed of different materials. Although the support 380B is shown as consisting of these two layers, the support 380B may include three or more layers. For instance, and although not shown, the multi-layered support 380B may include multiple stacks of the first and second support layers 380B_1 and 380B_2 or at least one support layer in addition to the first and second support layers 380B_1 and 380B_2.

In the illustrated example, the first support layer 380B_1 is in contact with the sidewalls SW1 of the contact plugs 350. The second support layer 380B_2 is disposed within the first support layer 380B_1 and thus, is spaced apart from the contact plugs 350.

Furthermore, the first support layer 380B_1 may comprise a metal oxide. For example, the first support layer 380B_1 may include at least one material selected from the group consisting of titanium oxide (TiO), tantalum oxide (TaO), tantalum titanium oxide (TaTiO), tantalum silicon oxide (TaSiO), and aluminum oxide (AlO). The second support layer 380B_2 may include at least one material selected from the group consisting of SiN, SiCN, SiOC, SiON, and SiOCN.

Another embodiment of a semiconductor device 400 according to the inventive concept will be described with reference to FIGS. 5A and 5B.

The semiconductor device 400 shown in FIGS. 5A and 5B has substantially the same configuration as the semiconductor device 300 described with reference to FIGS. 3A through 3C except that the semiconductor device 400 further includes insulating spacers 428 disposed in contact with sidewalls SW1 of the contact plugs 350 to thereby cover the sidewalls SW1. The insulating spacers 428 may comprise a nitride layer. Also, in this example, the insulating spacers 428 are exposed by the air spaces 370.

Another embodiment of a semiconductor device 500 according to the inventive concept will be described with reference to FIGS. 6A-6D.

The semiconductor device 500 shown in FIGS. 6A through 6C has substantially the same configuration as the semiconductor device 300 described with reference to FIGS. 3A through 3C except for supports 580.

Referring to 6A through 6C, in the semiconductor device 500, the supports 580 each include a plurality of discrete support pieces 582 spaced apart from one another in rows parallel to the lengthwise direction of the bit line stack structures 320. In this respect, the support pieces 582 are intermittently disposed over the entire length of the bit line stack structure 320. Thus, as shown in FIG. 6D, the width of each of the supports 580 varies in the first direction (X direction in FIGS. 6A and 6D). The support pieces 582 face sidewalls SW1 of the contact plugs 350 and are interposed between the insulating capping lines 324 of the bit line stack structures 320 and the contact plugs 350. Thus, the support pieces 582 limit the height of air spaces 370 to the height H3 as shown in FIG. 6B wherein H3 is less than the height (or thickness) of the stack structures 320.

Figure 6A:
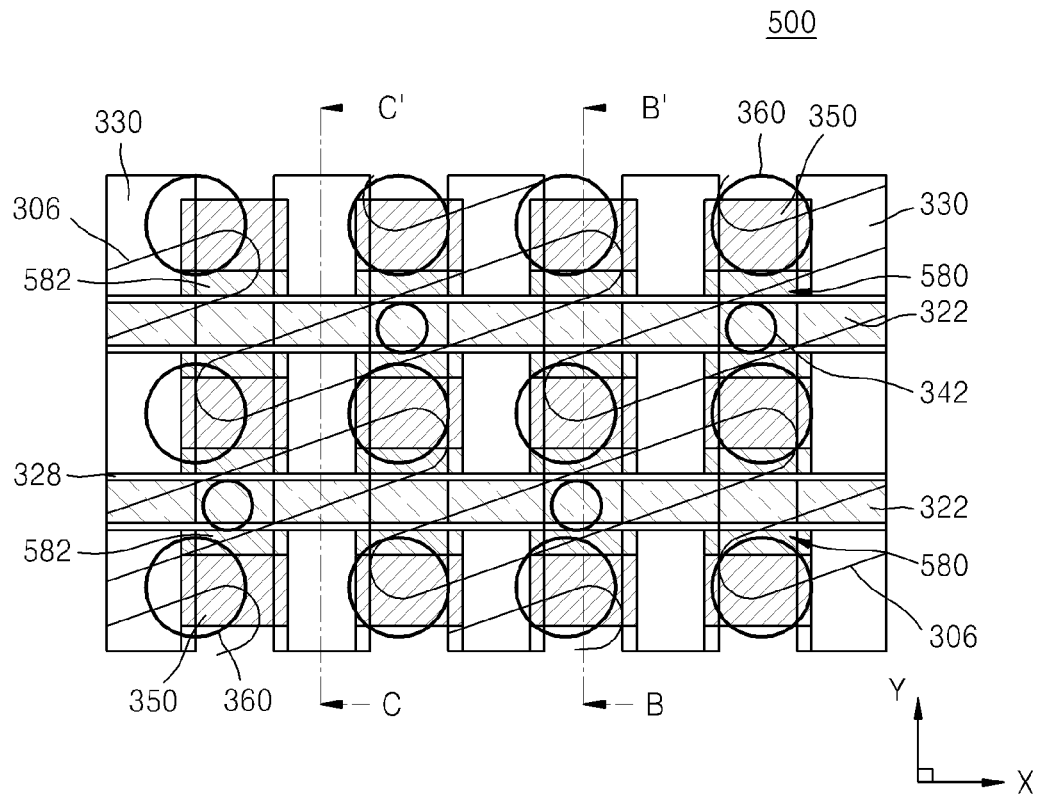
FIG. 6A is a diagram of the layout of another example of a semiconductor device according to the inventive concept.
Figure 6B:
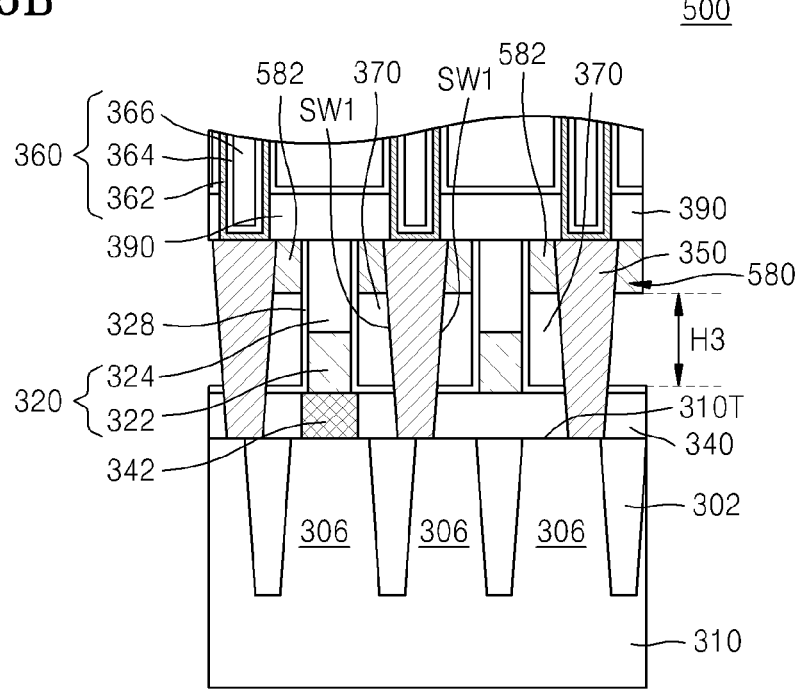
FIG. 6B is a cross-sectional view taken along line B-B' of FIG. 6A.
Figure 6C:
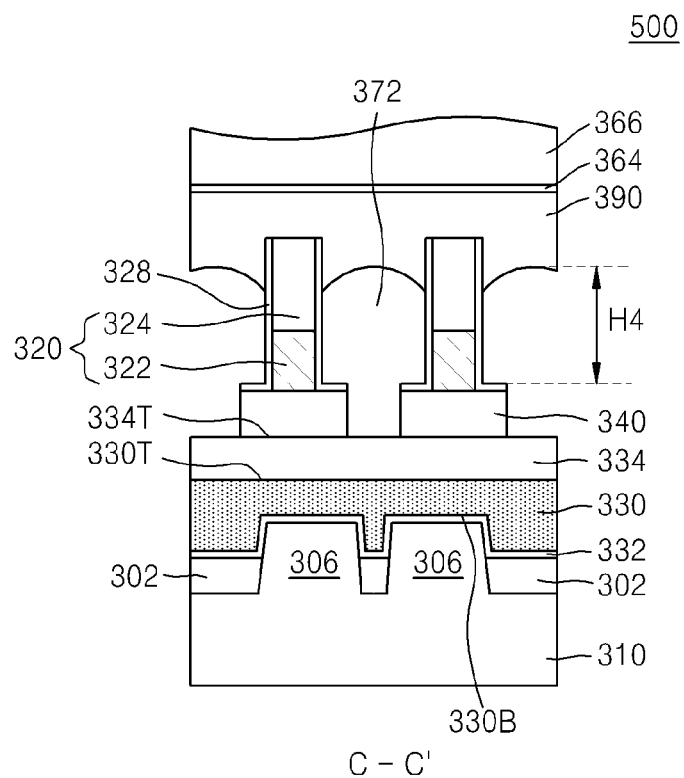
FIG. 6C is a cross-sectional view taken along line C-C' of FIG. 6A.
Figure 6D:
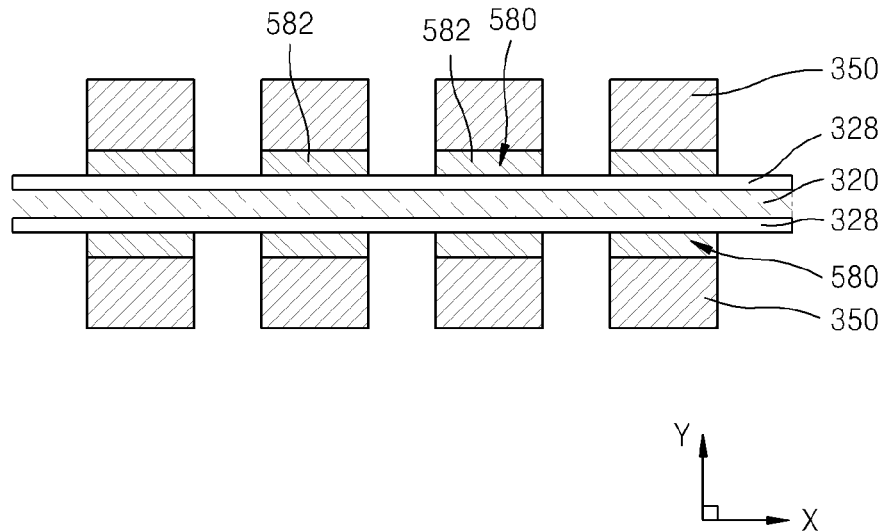
FIG. 6D is a plan view of a conductive structure of the semiconductor device of FIGS. 6A-6C.

An air gap 372 is provided between contact plugs 350 adjacent one another in the second direction (Y direction in FIG. 6A). Air spaces 370 communicate with the air gaps 372. Portions of the contact plugs 350, a portion of the insulating liner 328, and portions of the support pieces 582 are exposed by the air gaps 372. And, the height of the air gaps 372 may be limited by the second interlayer insulating layer 390 to height H4 as shown in FIG. 6C wherein H4 is less than the height (or thickness) of the stack structures 320.

In this embodiment, as described above, each support 580 is discontinuous. Therefore, an upper portion of each air gap 372 communicating with the air spaces 370 may be wider in this embodiment 400 of a semiconductor device according to the invention than in the semiconductor device 300 of the embodiment of FIGS. 3A through 3C. Accordingly, dielectric constants between the plurality of bit lines 322 and the plurality of contact plugs 350 may be less in this embodiment than in the embodiment of FIGS. 3A-3C. Accordingly, the capacitance between adjacent conductive lines may be lower in this embodiment than in the embodiment of FIGS. 3A-3C.

Another embodiment of a semiconductor device 600 according to the inventive concept will now be described with reference to FIGS. 7A-7D. As with the embodiment of FIGS. 3A-3D, this device having the layout shown in FIG. 7A may be a semiconductor memory device whose memory cells have a unit cell size of $6F^2$.

The semiconductor device 600 includes a substrate 610 in which a plurality of active regions 606 are defined by isolation regions 602.

Figure 7A:
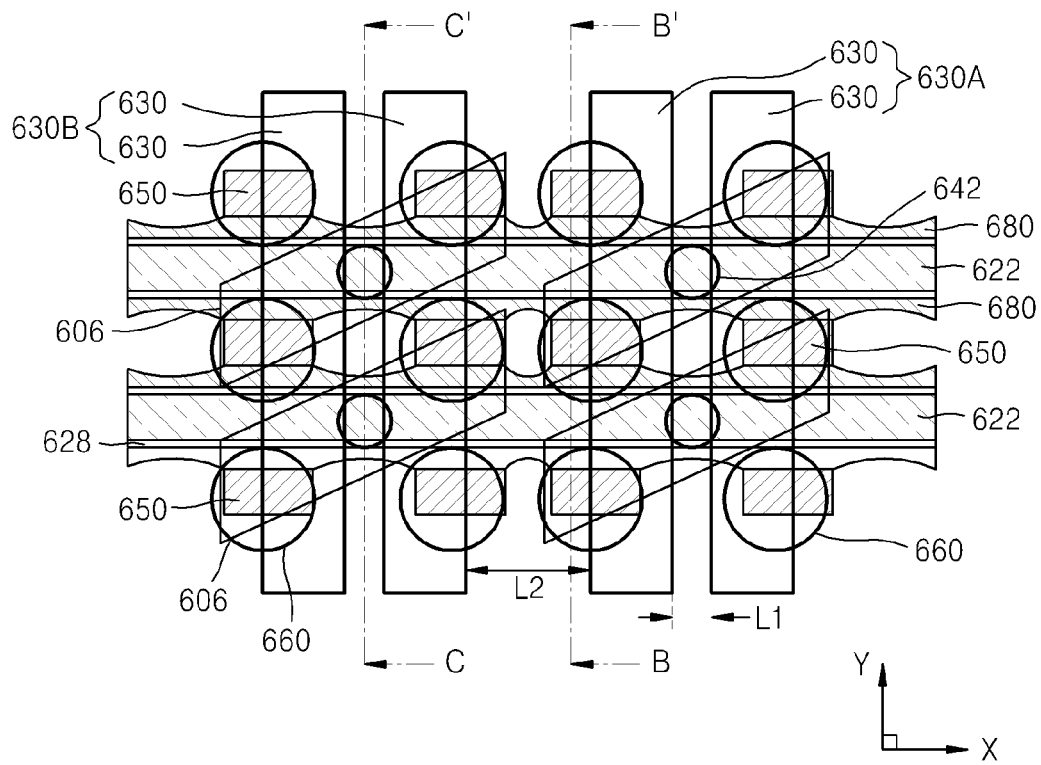
FIG. 7A is a diagram of the layout of another example of a semiconductor device according to the inventive concept.

A plurality of bit line stack structures 620 are disposed on the substrate 610 and extend parallel to one another in a first direction (X direction in FIG. 7A). Each of the bit line stack structures 620 may include a bit line 622 and an insulating capping line 624 stacked on the bit line 622.

A plurality of word lines 630 (refer to FIG. 7A) are buried in the substrate 610. Similarly to the word lines 330 described with reference to FIGS. 3A through 3C, the word lines 630 may be disposed at a level lower than that of a top surface of the substrate 610 and extend parallel to one another in a second direction (Y direction in FIG. 7A) orthogonal to the first direction.

Among the plurality of active regions 606, a plurality of active regions 606 are spaced from each other in a row in the first direction, and these active regions 606 extend parallel to one another and are aligned with a respective bit line 622. Also, among the plurality of active regions 606, two active regions 606 disposed adjacent to each other in the second direction are offset from one another by a predetermined distance in their longitudinal directions while still remaining parallel, i.e., are misaligned with each other.

Figure 7B:
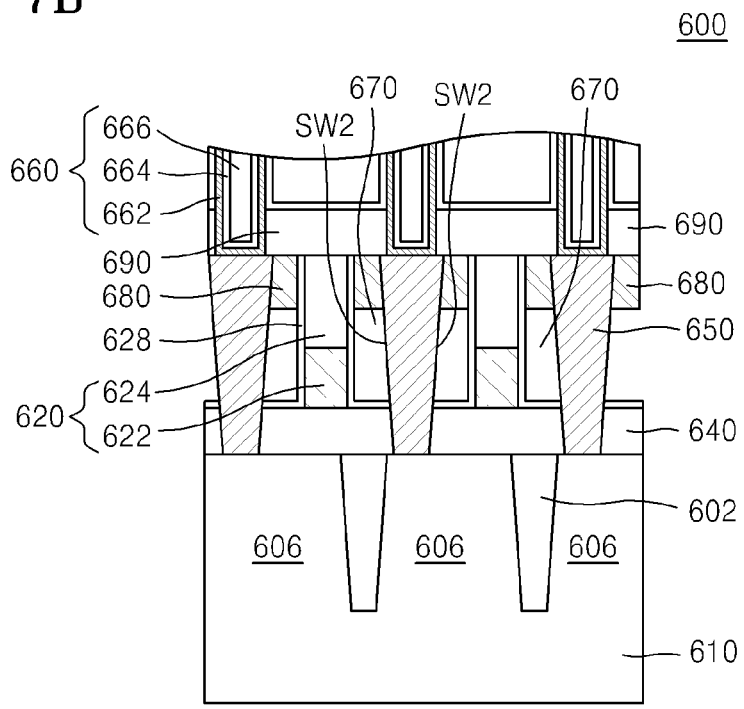
FIG. 7B is a cross-sectional view taken along line B-B' of FIG. 7A.
Figure 7C:
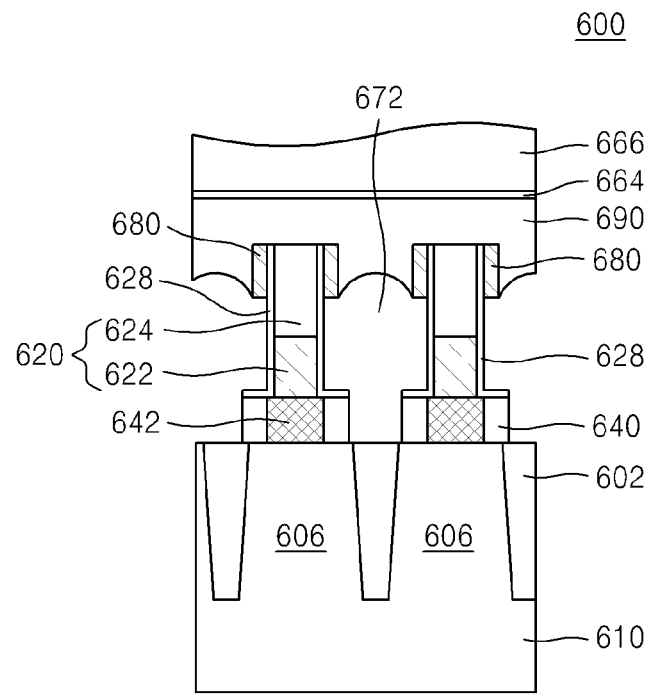
FIG. 7C is a cross-sectional view taken along line C-C' of FIG. 7A.

In the illustrated example of this embodiment, the distances between the word lines 630 are not uniform. Rather, the distance L1 between the word lines 630 of respective pairs thereof is smaller than the distance L2 between the adjacent pairs of the word lines. Thus, as shown in FIGS. 7A through 7C, the word lines 630 include a pair of word lines 630A and a pair of word lines 630B with the distance L1 between the word lines 630 of word line pair 630A equal to the distance L1 between the word lines 630 of adjacent word line pair 630B, and the distance L2 between the word line pair 630A and the word line pair 630B being greater than L1.

Otherwise, the substrate 610, the bit lines 622, the insulating capping lines 624, and the word lines 630 are similar to the substrate 310, the bit lines 322, the insulating capping lines 324, and the word lines 330 of the embodiment of FIGS. 3A through 3C.

Also similarly, the sidewalls of the bit line stack structures 620 may be covered with an insulating liner 628. In this case, the insulating liner 628 may comprise a silicon nitride layer.

The bit lines 622 may be connected to the active regions 606 by direct contacts 642 extending through a first interlayer insulating layer 640.

A plurality of contact plugs 650 are arranged in a row in the first direction (X direction in FIG. 7A) between adjacent ones of each pair of the bit line stack structures 620. A plurality of capacitors 660 may be disposed on the contact plugs 650, respectively. Each of the capacitors 660 may include a lower electrode 662, a dielectric layer 664, and an upper electrode 666. Accordingly, the plurality of contact plugs 650 may constitute a plurality of buried contacts (BCs) that electrically connect the lower electrodes 662 of the plurality of capacitors 660 with the active regions 606 of the substrate 610.

Each of the contact plugs 650 has a sidewall SW2 confronting a respective one of the bit lines 622 across an air space 670. A portion of the sidewall SW2 and a portion of the insulating liner 628 may be exposed by the air space 670. The air spaces 670 are collectively located above the substrate 310 by a distance at least equal to the thickness of the insulating liner 628.

Furthermore, air gaps 672 may be provided between contact plugs 650 adjacent one another in the second direction (Y direction in FIG. 7A). Also, air spaces 670 may communicate with the air gaps 672. A plurality of supports 680 are interposed between bit line stack structures 620 and the contact plugs 650. Portions of the contact plugs 650, the insulating liner 628, and the supports 680 may be exposed by the air gaps 672.

Figure 7D:
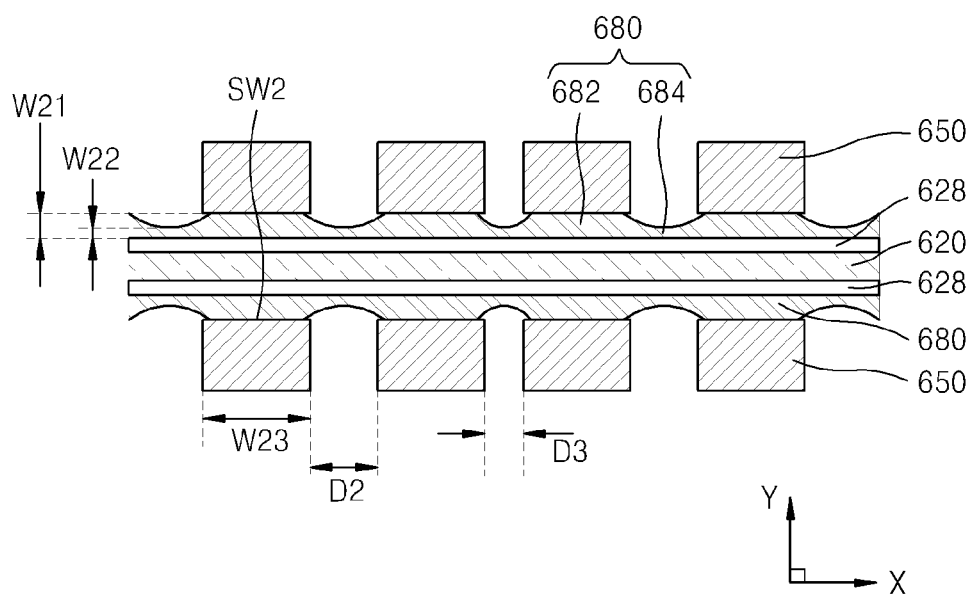
FIG. 7D is a plan view of a conductive structure of the semiconductor device of FIGS. 7A-7C.

Furthermore, referring to FIG. 7D, each support 680 in this embodiment extends continuously over the entire length of the bit line stack structures 620 in the first direction (X direction in FIGS. 7A and 7D), and has a width that varies along the first direction. Moreover, each support 380 may contact sidewalls SW2 of a plurality of contact plugs 650. More specifically, each support 380 may include a plurality of first support portions 682 facing and disposed in contact with sidewalls SW2 of a plurality of contact plugs 650, and a plurality of second support portions 684 that do not face the sidewalls SW2. The second support portions 684 may have uniform shapes. Also, the width W21 of the first support portions 682 (dimension in the second or Y direction in FIGS. 7A and 7D) is greater than the width W72 of the second support portions 684. Also, the maximum width of the support 680 may be the width W21 of the first support portions 682.

Also, the support 680 may be configured similarly to the support 380A shown in and described with reference to FIG. 4A or the support 380B shown in and described with reference to FIG. 4B.

The plurality of contact plugs 650 may have a uniform width W23. On the other hand, the distances between the contact plugs 650 (in the first or X direction) are not uniform. In the embodiment of FIGS. 7A-7D, these distances alternate between relatively short D3 and relatively long D2 distances. Thus, the second support portions 684 have different shapes.

In another example of this embodiment, although the distances between the word lines 630A are not uniform, the distances between the contact plugs 650 are uniform (with respect to the first or X direction).

Figure 8:
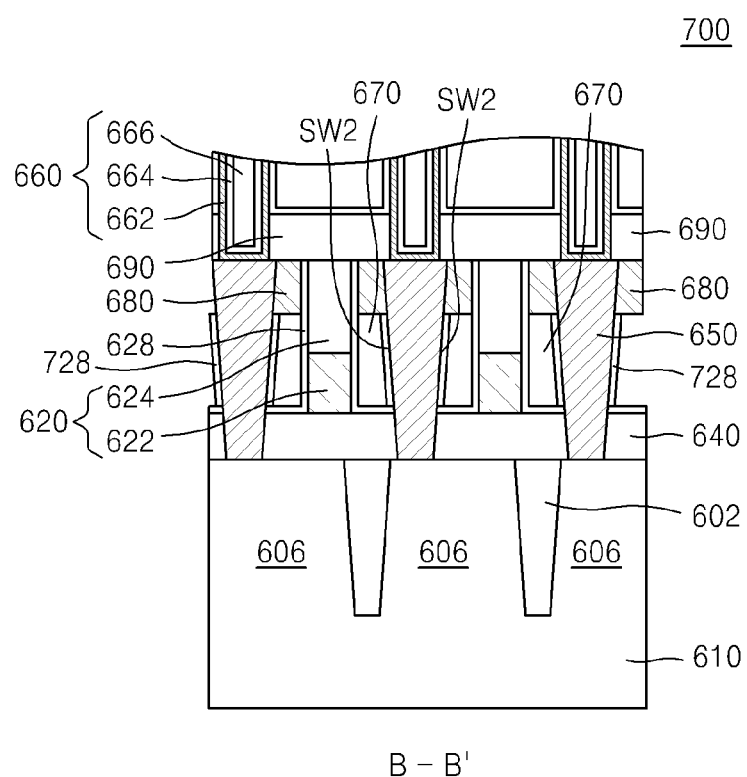
FIG. 8 is a cross-sectional view of a semiconductor device according to another exemplary embodiment of the inventive concept.

FIG. 8 shows another semiconductor device 700 according to the inventive concept. The semiconductor device 700 has substantially the same configuration as the semiconductor device 600 described with reference to FIGS. 7A through 7D except that the semiconductor device 700 further includes insulating spacers 728 disposed in contact with sidewalls SW2 of the contact plugs 650 so as to cover the sidewalls SW2 (similar to the insulating spacers 428 described with reference to FIGS. 5A and 5B). The insulating spacers 728 thus may be exposed by the air spaces 670.

Another embodiment of a semiconductor device 800 according to the inventive concept will now be described with reference to FIGS. 9A-9D. The semiconductor device 800 has substantially the same configuration as the semiconductor device 600 described with reference to FIGS. 7A through 7C except for supports 880.

Figure 9A:
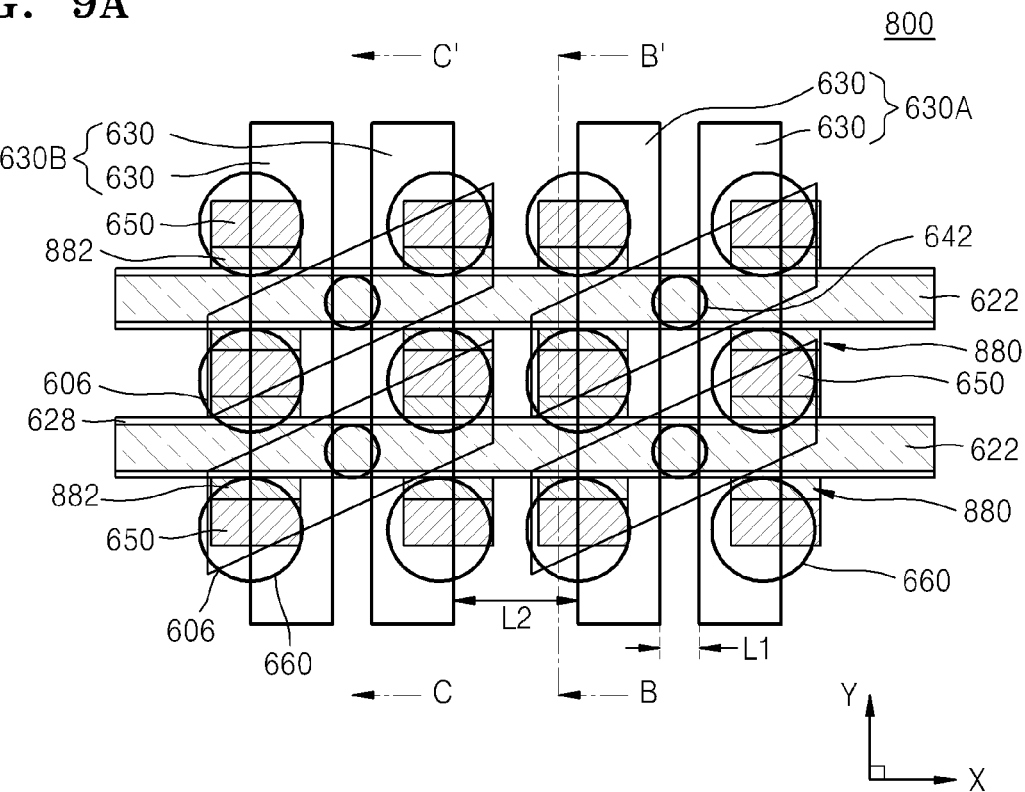
FIG. 9A is a schematic layout of another example of a semiconductor device according to the inventive concept.
Figure 9B:
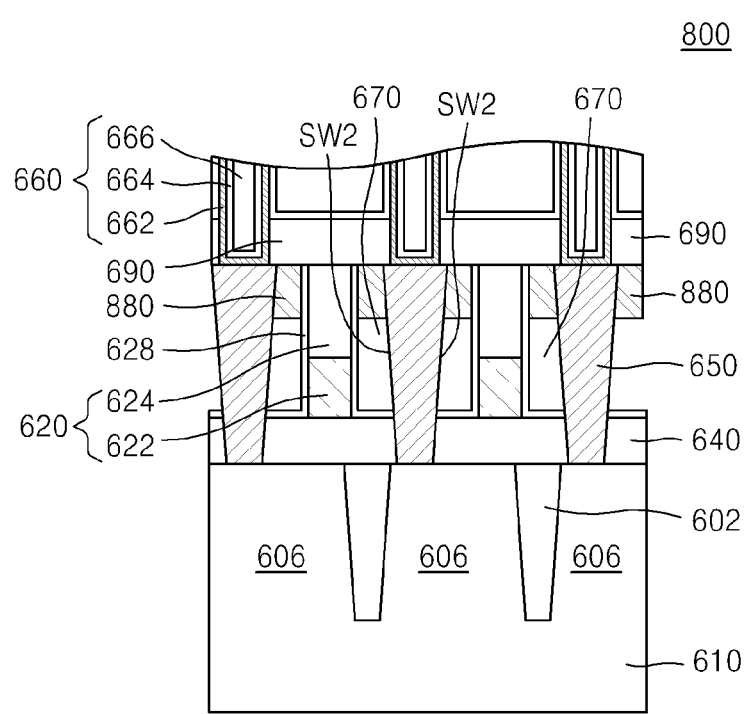
FIG. 9B is a cross-sectional view taken along line B-B' of FIG. 9A.
Figure 9C:
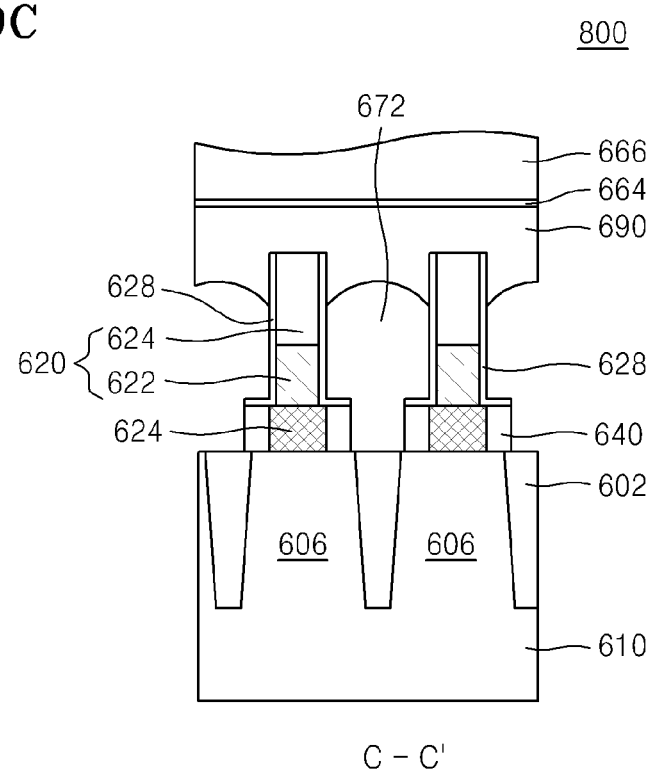
FIG. 9C is a cross-sectional view taken along line C-C' of FIG. 9A.
Figure 9D:
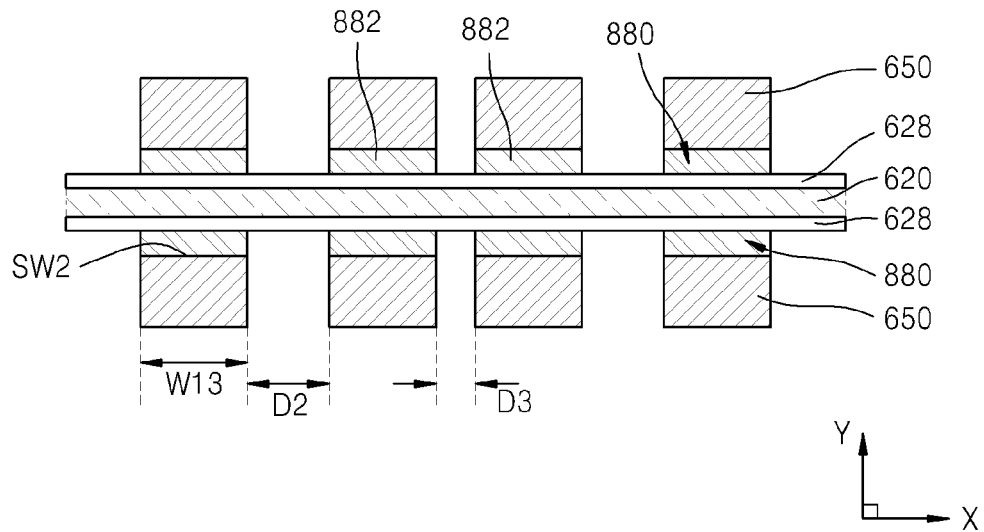
FIG. 9D is a plan view of a conductive structure of the semiconductor device of FIGS. 9A-9C.

As shown in FIG. 9D, the support 880 is similar to the support 580 of the embodiment of FIGS. 6A-6D in that the support includes a plurality of support pieces 882 facing the sidewalls SW2 of the plurality of contact plugs 650. The distances by which the support pieces 882 are spaced apart may be uniform or not as in the illustrated example. In the latter case, the distances D2 and D3 may correspond to those at which the contact plugs 650 are spaced as described with reference to the embodiment of FIGS. 7A-7D.

A method of manufacturing the semiconductor device 300 shown in FIGS. 3A through 3C will be described as an example with reference to FIGS. 10A-19B.

Figure 10A:
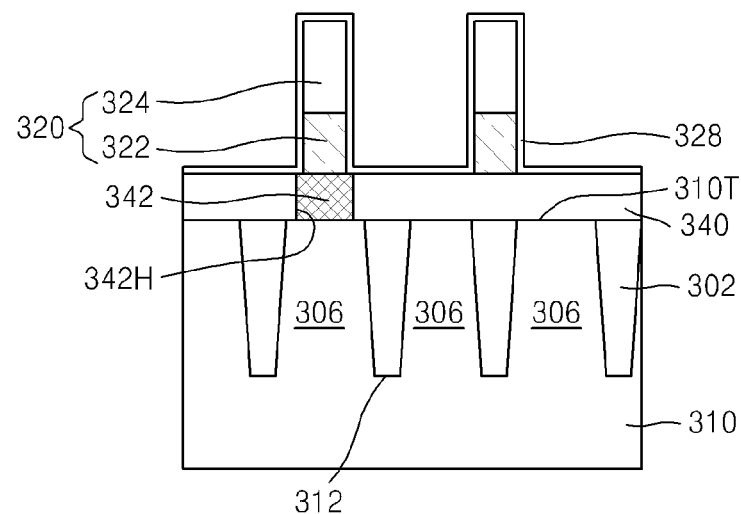
FIGS. 10A-19B illustrate a method of manufacturing a semiconductor device according to the inventive concept, with FIGS. 10A, 11A, 12A, 13A, 14A, 15A, 16A, 17A, 18A and 19A each being a cross-sectional view taken in the same direction as line B-B' of FIG. 3A, and each of FIGS. 10B, 11B, 12B, 13B, 14B, 15B, 16B, 17B, 18B and 19B each being a cross-sectional view taken in the same direction as line C-C' of FIG. 3A.
Figure 10B:
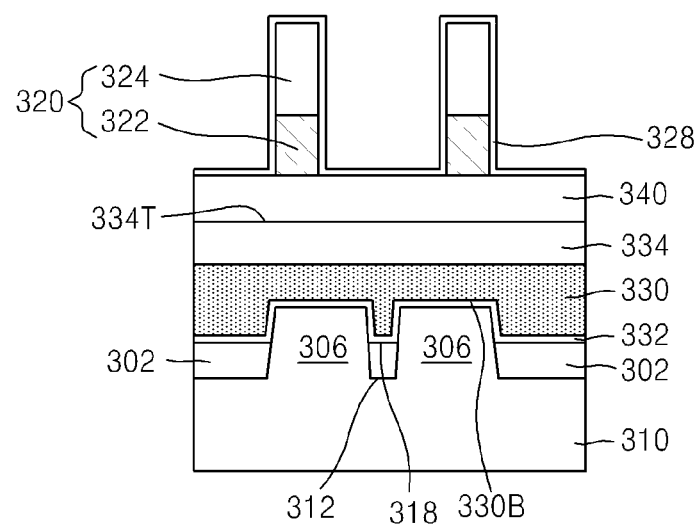

Referring to FIGS. 10A and 10B, isolation trenches 312 are formed in a substrate 310 and filled with an insulating layer, thereby forming isolation regions 302. A plurality of active regions 306 are defined by the isolation regions 302 in the substrate 310.

Thereafter, a plurality of word line trenches 318 may be formed in the substrate 310. The plurality of word line trenches 318 may extend parallel to one another. Each of the word line trenches 318 may have an elongated or linear shape crossing the plurality of active regions 306. As shown in FIG. 10B, the isolation regions 302 and the substrate 310 may be etched to different depths using additional etching processes to form steps at the bottoms of the word line trenches 318.

After cleaning the resultant structure having the plurality of word line trenches 318, a gate dielectric layer 332, a word line 330, and a buried insulating layer 334 are sequentially formed in this order within the plurality of word line trenches 318. In one example, the gate dielectric layer 332 is formed to a thickness of about 20 Å to about 70 Å.

Then, impurities may be implanted into the substrate 310 on both sides of the word line 330 so that source and drain regions (not shown) are formed at top surfaces of the plurality of active regions 306.

A first interlayer insulating layer 340 is then formed on the substrate 310 to cover a top surface 310T of the substrate 310 and the buried insulating layer 334.

Afterwards, a portion of the first interlayer insulating layer 340 may be etched to form a plurality of direct contact (DC) holes 342H exposing the active regions 306. In this case, the direct contact holes 342H are filled with conductive material, thereby forming a plurality of DCs 342 that are electrically connected to the active regions 306.

A plurality of bit line stack structures 320 are formed on the first interlayer insulating layer 340. The bit line stack structures 320 may include a plurality of bit lines 322 and a plurality of insulating capping lines 324 covering the plurality of bit lines 322. The bit lines 322 may be electrically connected to the plurality of DCs 342, respectively.

In an example of forming the bit line stack structures 320 in this method, a conductive layer is initially formed on the first interlayer insulating layer 340, and an insulating layer is formed over the conductive layer. The insulating layer may be thicker than the conductive layer. The insulating layer is then patterned to form the plurality of insulating capping lines 324. After that, the conductive layer is etched using the insulating capping lines 324 as an etch mask, thereby forming the bit lines 322.

An insulating liner 328 may be formed to cover exposed top surfaces and sidewalls of the plurality of the insulating capping lines 324 and the plurality of bit lines 322 and an exposed surface of the first interlayer insulating layer 340. In an example of this embodiment, the insulating liner 328 is used as an etch stop layer during a subsequent process. The insulating liner 328 thus may be used to protect the bit line stack structures 320. As examples, the insulating liner 328 may be a silicon nitride layer and may be formed to a thickness of about 30 Å to about 80 Å.

Figure 11A:
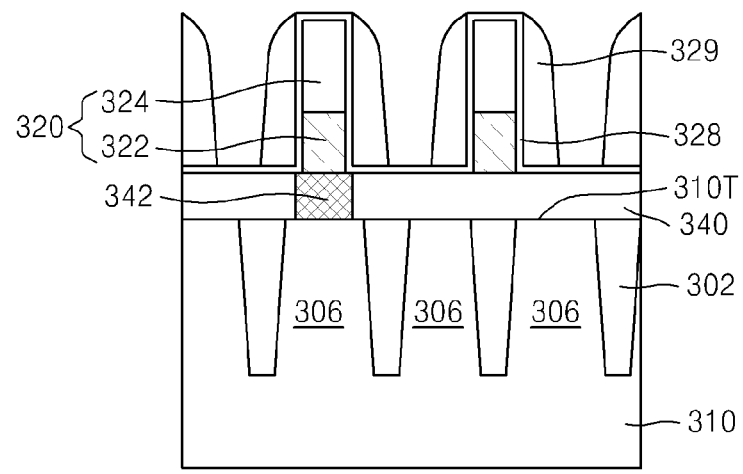
Figure 11B:
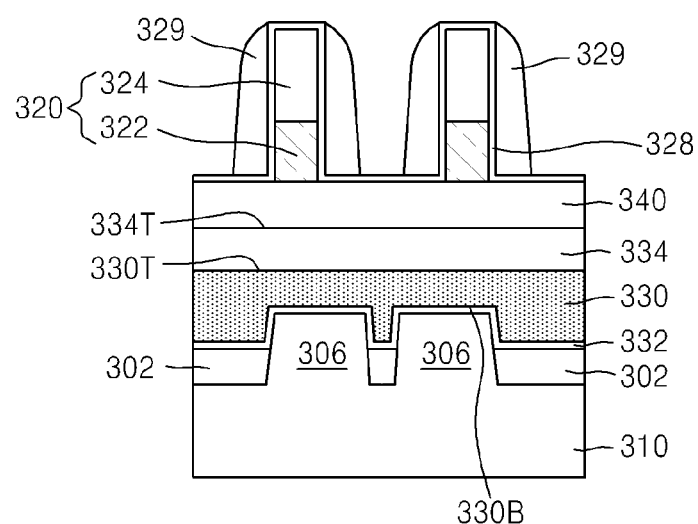

Referring to FIGS. 11A and 11B, a sacrificial layer is deposited on the resultant structure having the insulating liner 328 and etched back using the insulating liner 328 as an etch stop layer so that a plurality of sacrificial spacers 329 are formed to cover the insulating liner 328 on both sidewalls of the bit line stack structures 320. As examples, the sacrificial spacers 329 may be formed of compounds comprising silicon oxide or SiGe. However, the sacrificial spacers 329 may be formed of any material having an etch selectivity with respect to the insulating liner 328. That is, the sacrificial spacers 329 may be formed of an insulating material or a conductive material.

Figure 12A:
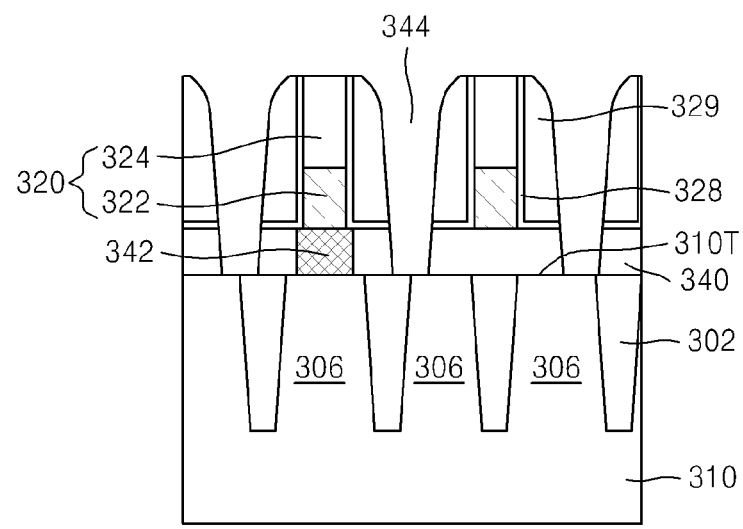
Figure 12B:
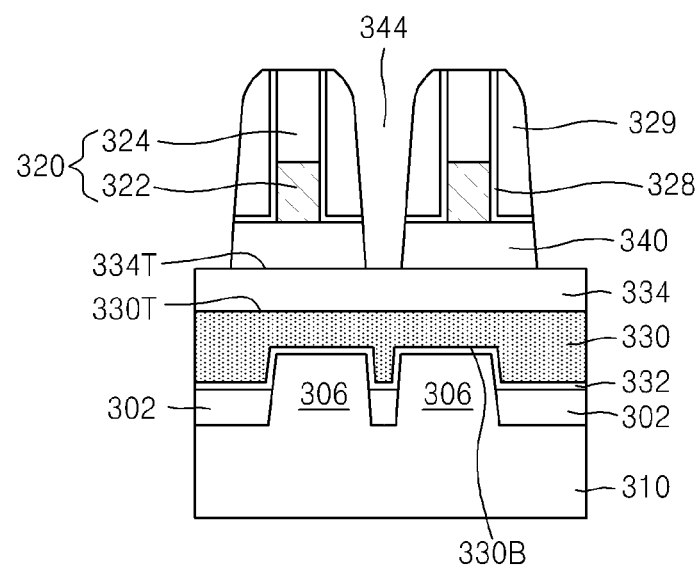

Referring to FIGS. 12A and 12B, an exposed portion of the insulating liner 328 is etched to expose a portion of the first interlayer insulating layer 340. Afterwards, the exposed portion of the first interlayer insulating layer 340 is etched using the insulating capping lines 324 and the sacrificial spacers 329 as an etch mask, thereby forming a plurality of space lines 344. The plurality of space lines 344 may extend parallel to the plurality of bit lines 322. A plurality of the active regions 306 may be exposed through one of the plurality of space lines 344.

Figure 13A:
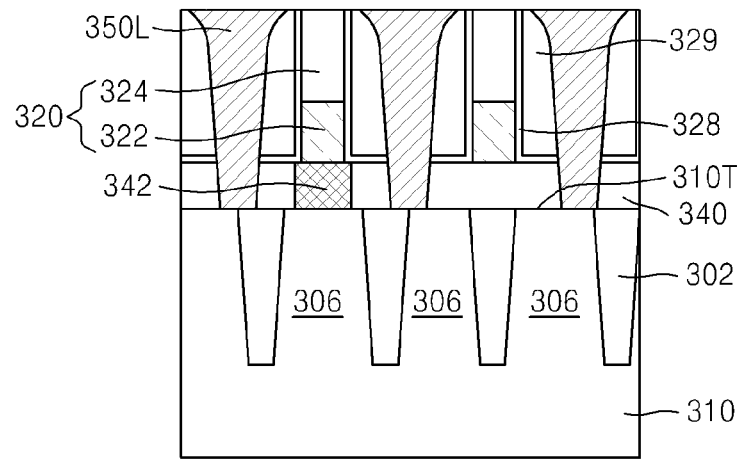
Figure 13B:
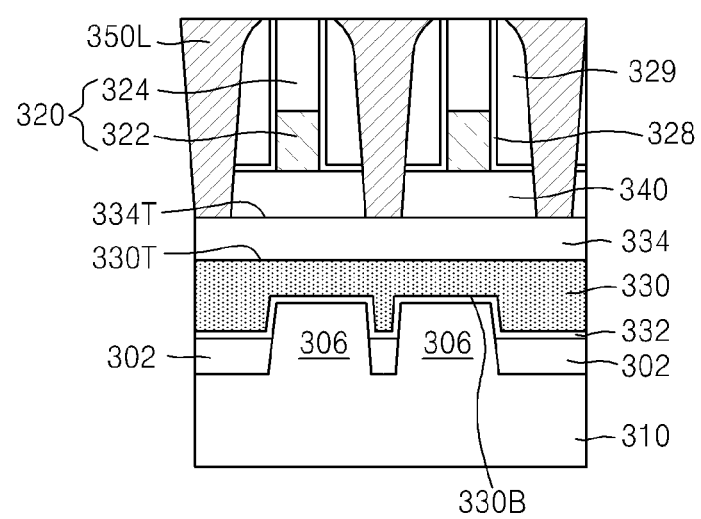

Referring to FIGS. 13A and 13B, a conductive material is deposited on the substrate 310 and the plurality of bit line stack structures 320 to fill the spaces of the plurality of space lines 344 to form a conductive layer. For example, the conductive layer may be formed of doped poly-Si, a metal, a metal silicide, a metal nitride, or a combination thereof.

Afterwards, part of the conductive layer is removed by an etchback process or a chemical mechanical polishing (CMP) process, for example, until top surfaces of the plurality of bit line stack structures 320 are exposed, thereby forming contact plug layers 350L filling the space lines 344, respectively. Each of the contact plug layers 350L may have a linear shape extending lengthwise in the lengthwise direction of the bit line stack structures 320.

Figure 14A:
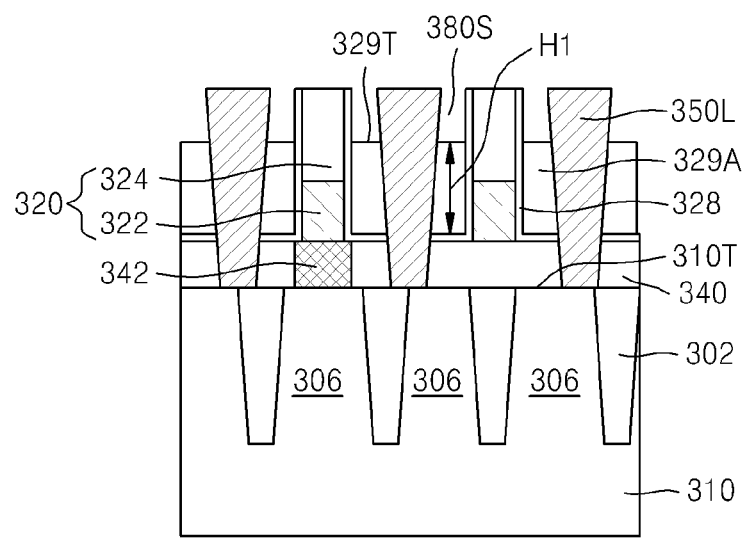
Figure 14B:
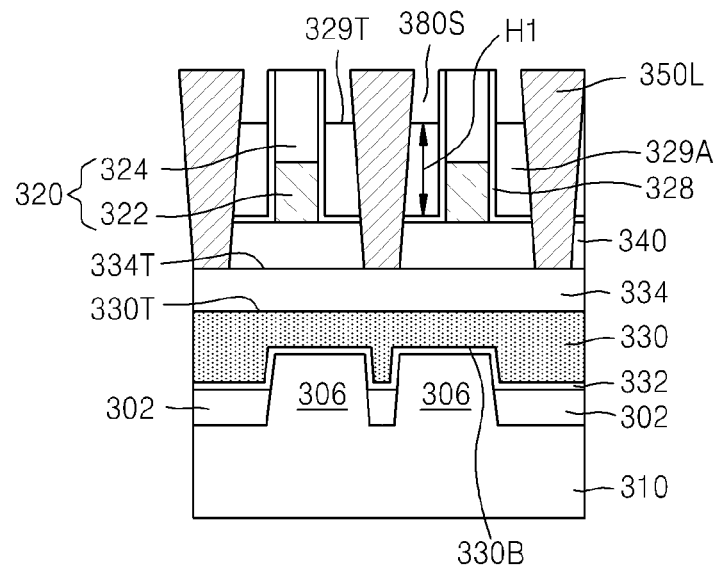

Referring to FIGS. 14A and 14B, the plurality of sacrificial spacers 329 may be etched by a wet or dry etching process to a predetermined depth from a top surface thereof, thereby forming a plurality of sacrificial spacer patterns 329A having a height H1.

Top surfaces 329T of the plurality of sacrificial spacer patterns 329A may be disposed at a level higher than that of the top surface of the plurality of bit lines 322. However, the inventive concept is not limited thereto. For example, the top surfaces 329T of the plurality of sacrificial spacer patterns 329A may be disposed at the same level as or at a level lower than the top surface of the plurality of bit lines 322.

Consequently, support spaces 380S are provided between the bit line stack structures 320 and the contact plug layers 350L. Each of the support spaces 380S may extend linearly, i.e., may be elongated, in the lengthwise direction of the bit line stack structures 320.

Figure 15A:
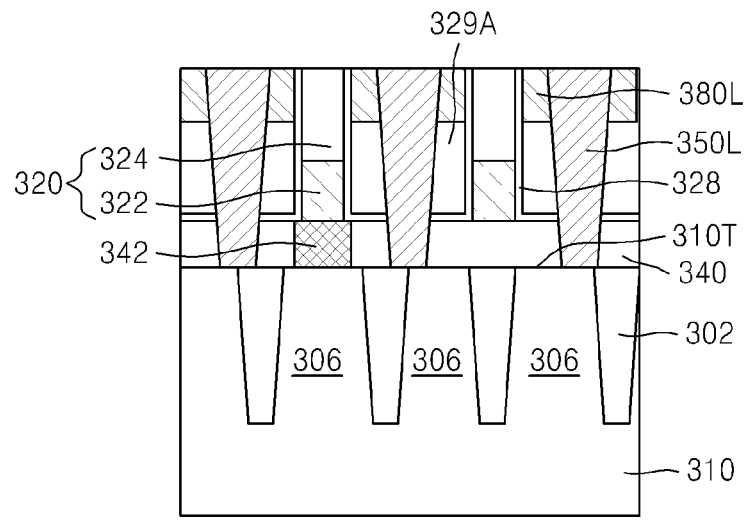
Figure 15B:
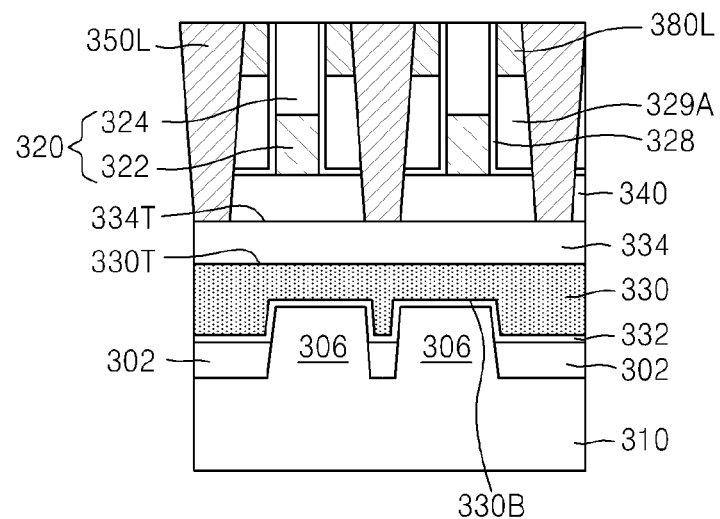

Referring to FIGS. 15A and 15B, support material is formed on the substrate 310 to fill the plurality of support spaces 380S. The support material may include at least one material selected from the group consisting of SiN, SiCN, SiOC, SiON, SiOCN, TiO, TaO, TaTiO, TaSiO, and AlO. The support material is then planarized by an etchback process or a CMP process until top surfaces of the plurality of contact plug layers 350L are exposed, thereby forming a plurality of support layers 380L in the plurality of support spaces 380S, respectively.

As a result, each of the support layers 380L may extend linearly, i.e., may be elongated, in the lengthwise direction of the bit line stack structures 320. Also, using these steps, the support layers 380L may take the form of the support 380A or 380B shown in and described with reference to FIG. 4A and FIG. 4B.

Figure 16A:
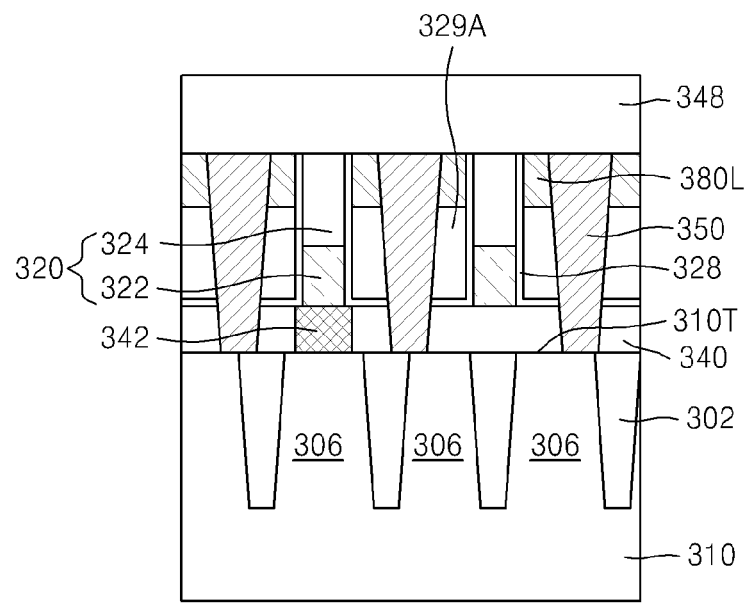
Figure 16B:
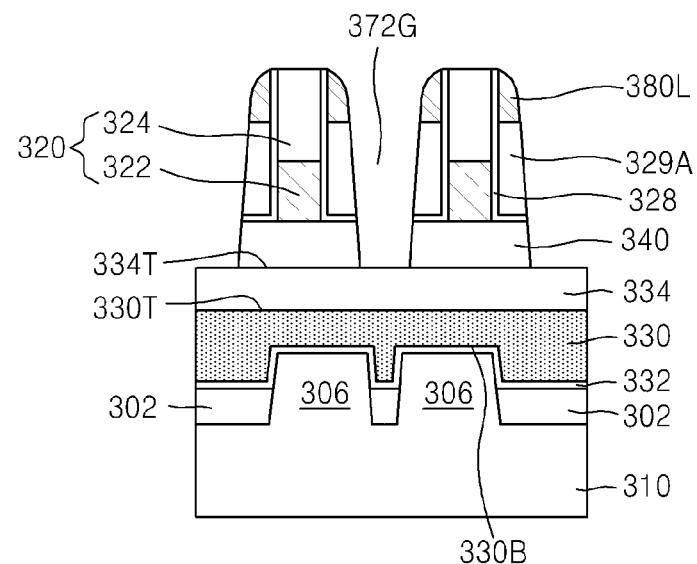

Referring to FIGS. 16A and 16B, portions of the plurality of contact plug layers 350L are removed to form a plurality of contact plugs 350.

For example, a plurality of line-shaped mask patterns 348 are formed on the substrate 310 to expose portions of the contact plug layers 350L. The line-shaped mask patterns 348 may extend across the contact plug layers 350L. The contact plug layers 350L are etched using the mask pattern 348, the plurality of bit line stack structures 320, and the insulating liner 328 as an etch mask, thereby forming a plurality of gaps 372G. The top surfaces 334T of the buried insulating layers 334, the top surface 310T of the substrate 310 (i.e., the top surface of the plurality of active regions 306), and sidewalls of the plurality of sacrificial spacer patterns 329A are exposed by the plurality of gaps 372G. The contact plugs 350 may be spaced apart from one another with the plurality of gaps 372G defined therebetween.

Figure 17A:
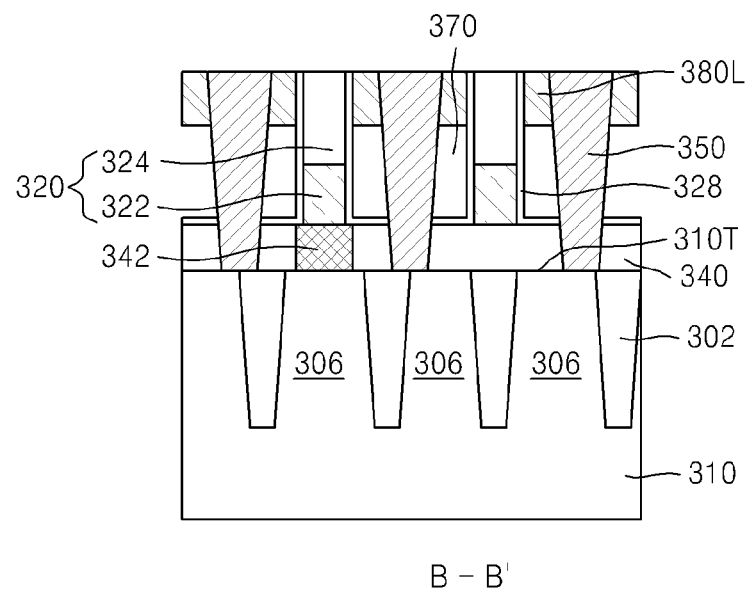
Figure 17B:
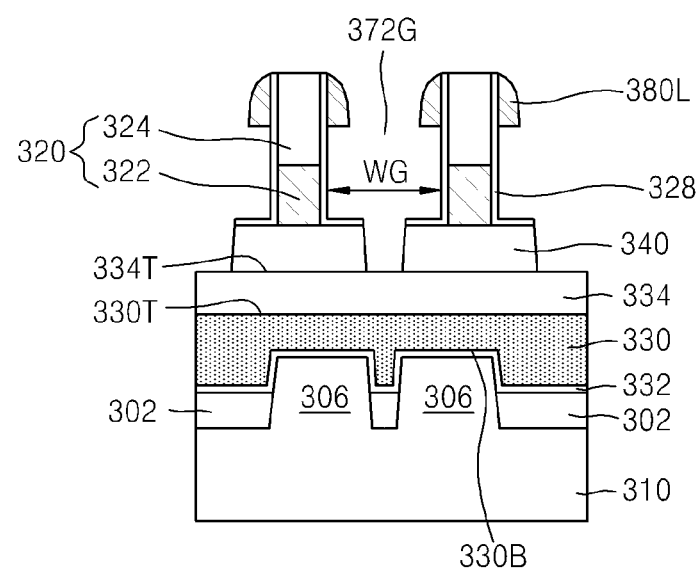

Referring to FIGS. 17A and 17B, the mask pattern 348 are removed, and the plurality of sacrificial spacer patterns 329A exposed by the gaps 372G are removed, thereby forming air spaces 370 between the plurality of bit line stack structures 320 and the plurality of contact plugs 350. In this respect, the sacrificial spacer patterns 329A may be removed using a wet etching process.

The insulating liner 328 and the plurality of contact plugs 350 in this example are exposed by the air spaces 370. Forming the air spaces 370 increases the width WG of gaps 372G so that the insulating liner 328 and the plurality of support layers 380L become exposed by the gaps 372G.

Figure 18A:
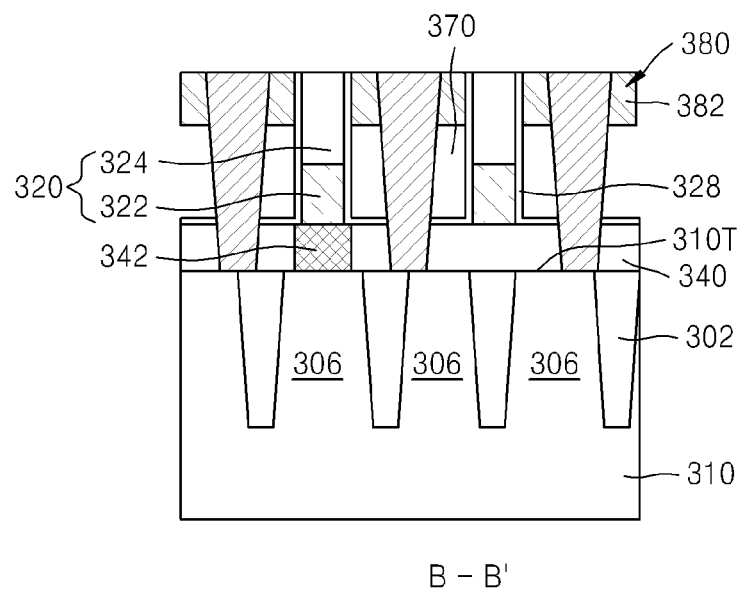
Figure 18B:
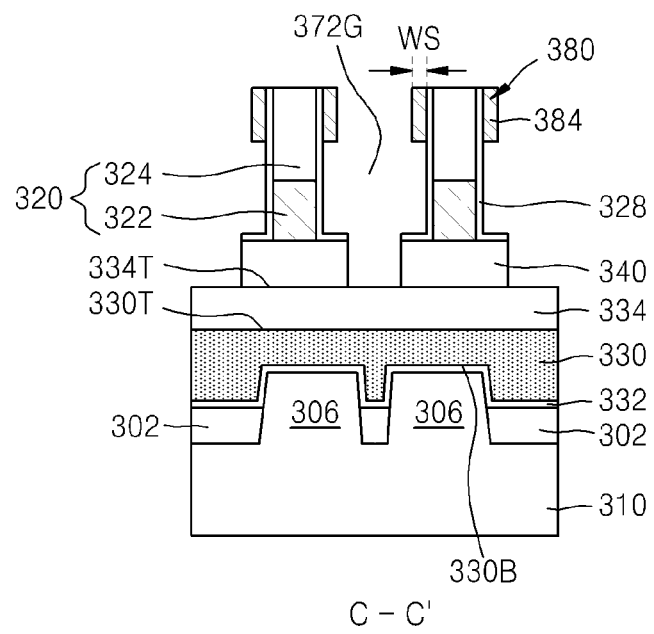

Referring to FIGS. 18A and 18B, portions of the support layers 380L, which are exposed by the plurality of gaps 372G, are removed to form a plurality of supports 380. In this case, the width of the plurality of support layers 380L between the plurality of bit line stack structures 320 and the plurality of contact plugs 350 is not affected, and only the width of the portions of the support layers 380L which do not face the contact plugs 350 is reduced. As a result, each support 380 includes a plurality of first support portions 382 interposed between a respective bit line stack structure 320 and a plurality of the contact plugs 350 and having a relatively large width, and a plurality of second support portions 384 that do not face the contact plugs 350 and have a relatively small width WS.

Figure 19A:
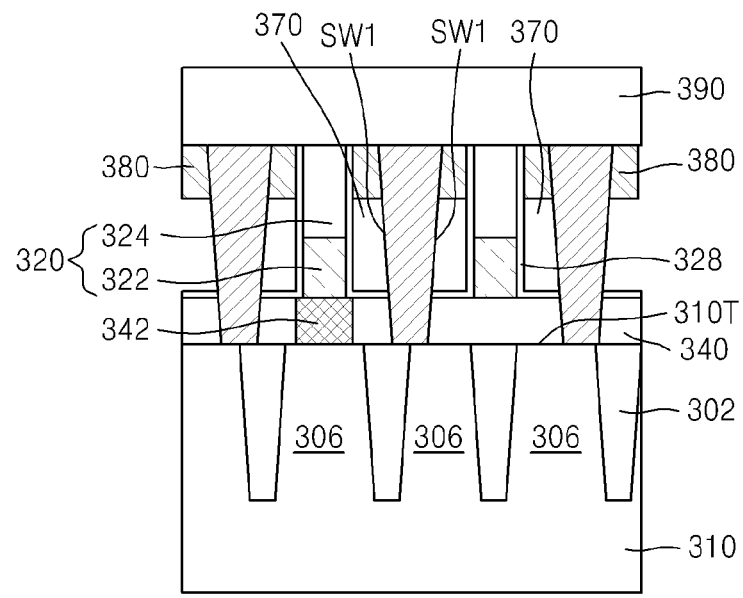
Figure 19B:
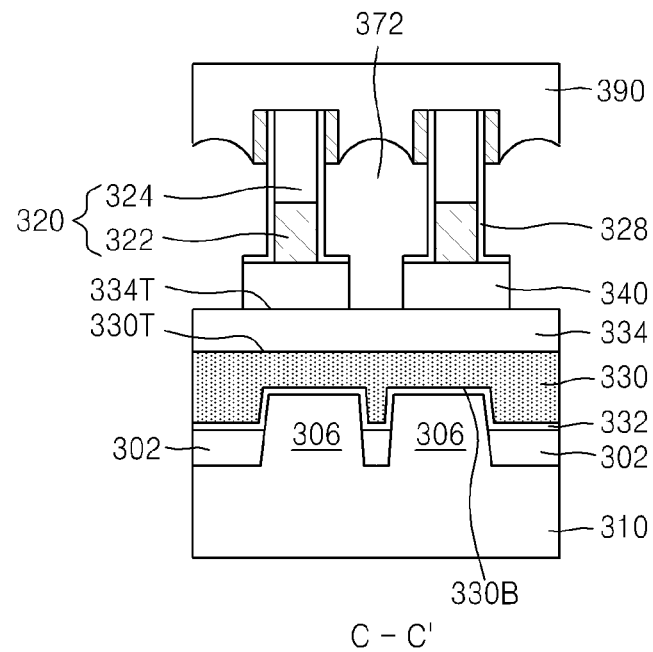

Referring to FIGS. 19A and 19B, insulating material is deposited on the substrate 310 to form a second interlayer insulating layer 390 covering the plurality of bit line stack structures 320, the plurality of contact plugs 350, and the plurality of supports 380. The second interlayer insulating layer 390 may be formed of an oxide layer, a nitride layer, or a combination thereof. For example, the second interlayer insulating layer 390 may be formed of a high-density plasma (HDP) oxide.

Also, the second interlayer insulating layer 390 is formed so as to not fill the gaps 372G completely. To this end, deposition conditions under which the second interlayer insulating layer 390 may be is formed are controlled. For example, the second interlayer insulating layer 390 is formed by a deposition process whose conditions are controlled so as to limit the step coverage otherwise produced by the deposition process.

A plurality of capacitors 360 may then be formed to complete the semiconductor device 300 shown in FIGS. 3A through 3C.

For example, a mold layer (not shown) is formed on the second interlayer insulating layer 390. The mold layer and the first interlayer insulating layer 390 are then etched to form a plurality of storage node holes (not shown) exposing top surfaces of the respective contact plugs 350. A plurality of cylindrical lower electrodes 362 are then conformally formed along the sides and bottoms of the storage node holes. Then the mold layer is removed, and the dielectric layers 364 and upper electrodes 366 are sequentially formed on the lower electrodes 362.

An embodiment of a method of manufacturing the semiconductor device 400, shown in and described with reference to FIGS. 5A and 5B, according to the inventive concept will now be described with reference to FIGS. 20A-28B.

A method of manufacturing will be described as an example with reference to FIGS. 20A through 28A and 20B through 28B.

Figure 20A:
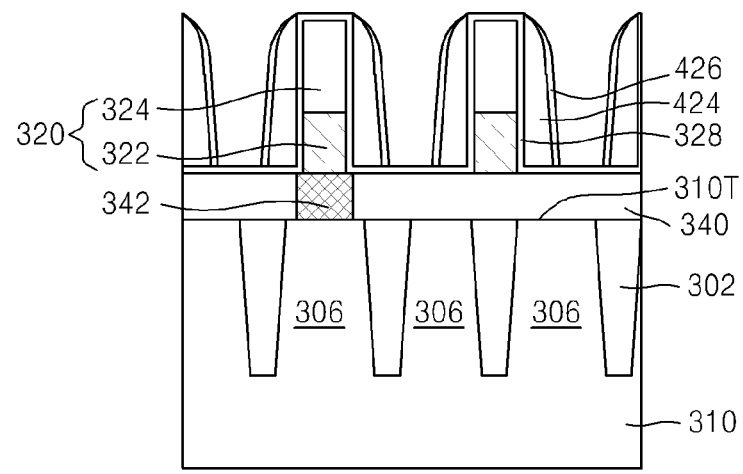
FIGS. 20A-28B illustrate another method of manufacturing a semiconductor device according to the inventive concept, with FIGS. 20A, 21A, 22A, 23A, 24A, 25A, 26A, 27A and 28A each being a cross-sectional view taken in the same direction as line B-B' of FIG. 3A, and FIGS. 20B, 21B, 22B, 23B, 24B, 25B, 26B, 27B and 28B each being a cross-sectional view taken in the same direction as line C-C' of FIG. 3A.
Figure 20B:
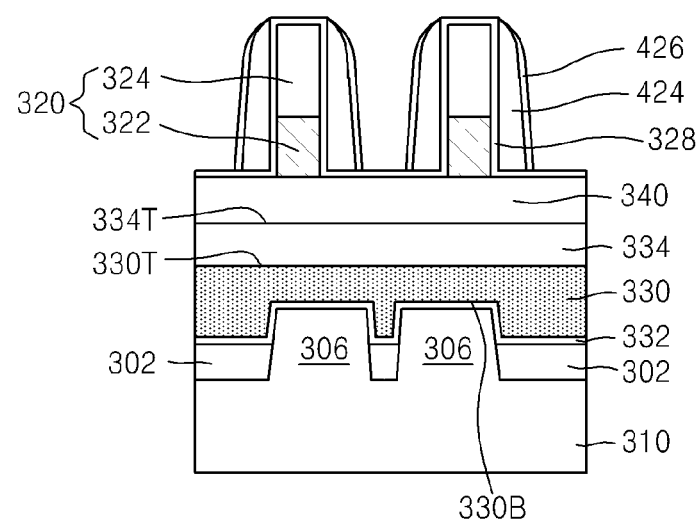

Referring to FIGS. 20A and 20B, a plurality of bit line stack structures 320 and an insulating liner 328 are formed on a substrate 310 in the same manner as described with reference to FIGS. 10A and 10B, and a plurality of first sacrificial spacers 424 and a plurality of second sacrificial spacers 426 covering the insulating liner 328 are formed on both side surfaces of the plurality of bit line stack structures 320 in a manner similar to that described with reference to FIGS. 11A and 11B.

The first sacrificial spacers 424 may be formed of a compound containing silicon oxide or SiGe. The second sacrificial spacers 426 may be formed of silicon nitride. However, as the word "may" implies, the inventive concept is not limited to forming the first sacrificial spacers 424 and second sacrificial spacers 426 of these materials.

Figure 21A:
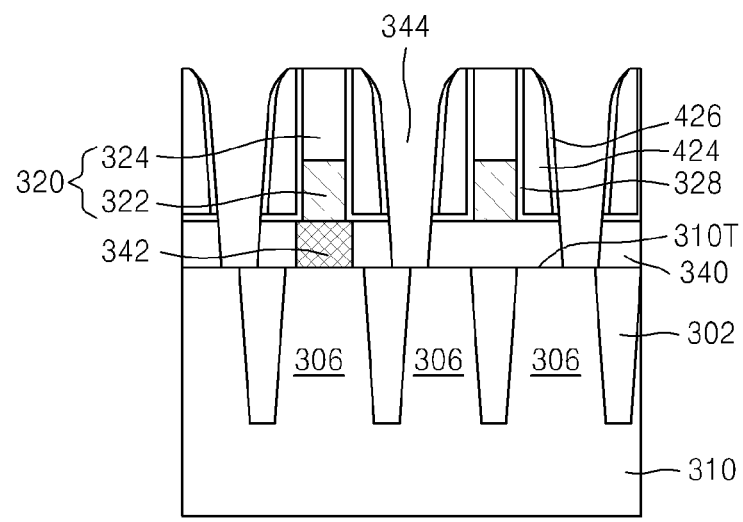
Figure 21B:
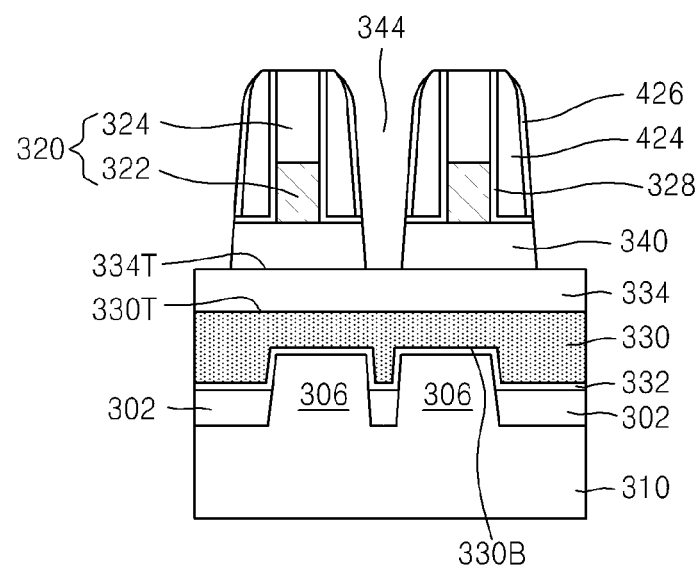

Referring to FIGS. 21A and 21B, an exposed portion of the insulating liner 328 is etched to expose a portion of the first interlayer insulating layer 340. Afterwards, the exposed portion of the first interlayer insulating layer 340 is etched using the plurality insulating capping lines 324 and the plurality of second sacrificial spacers 426 as an etch mask, thereby forming a plurality of space lines 344.

Figure 22A:
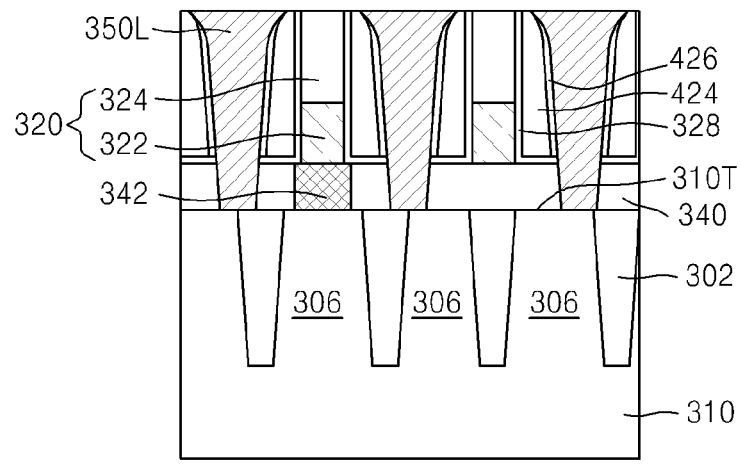
Figure 22B:
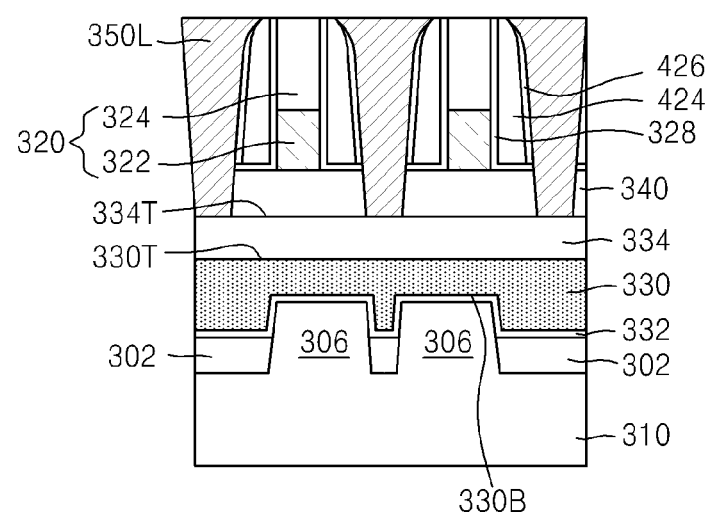

Referring to FIGS. 22A and 22B, contact plug layers 350L are formed in the space lines 344 in the same manner as described with reference to FIGS. 13A and 13B.

Figure 23A:
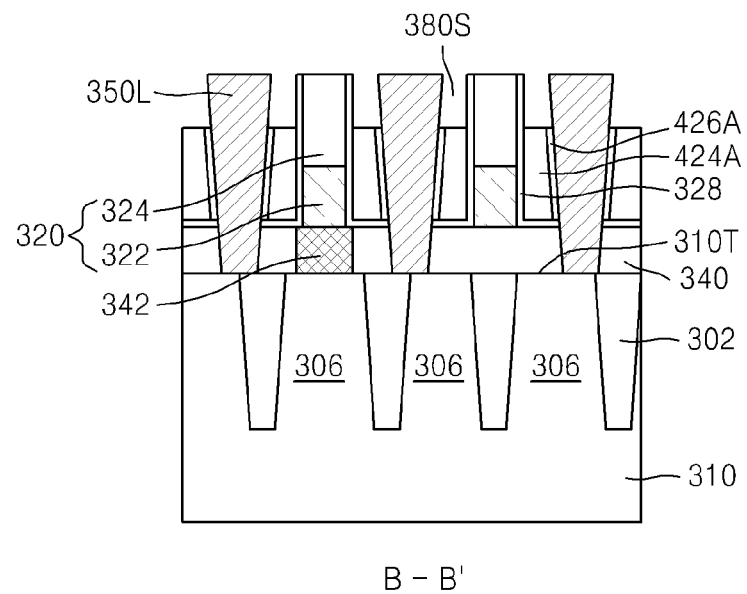
Figure 23B:
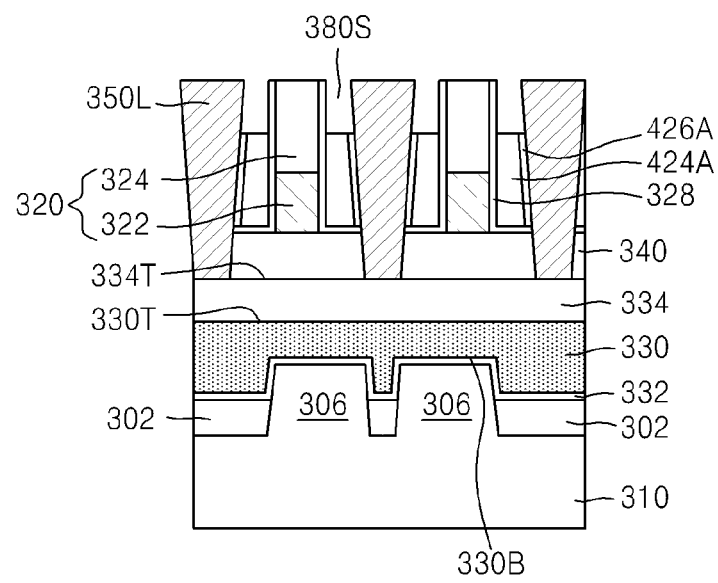

Referring to FIGS. 23A and 23B, the plurality of first sacrificial spacers 424 and the plurality of second sacrificial spacers 426 are etched to a predetermined depth from top surfaces thereof in a manner similar to that described with reference to FIGS. 14A and 14B, thereby forming a plurality of first sacrificial spacer patterns 424A and a plurality of second sacrificial spacer patterns 426A.

As a result, a plurality of support spaces 380S are provided between the bit line stack structures 320 and the contact plug layers 350L. Each of the support spaces 380S may extend linearly, i.e., may be elongated, in the lengthwise direction of the bit line stack structures 320.

Figure 24A:
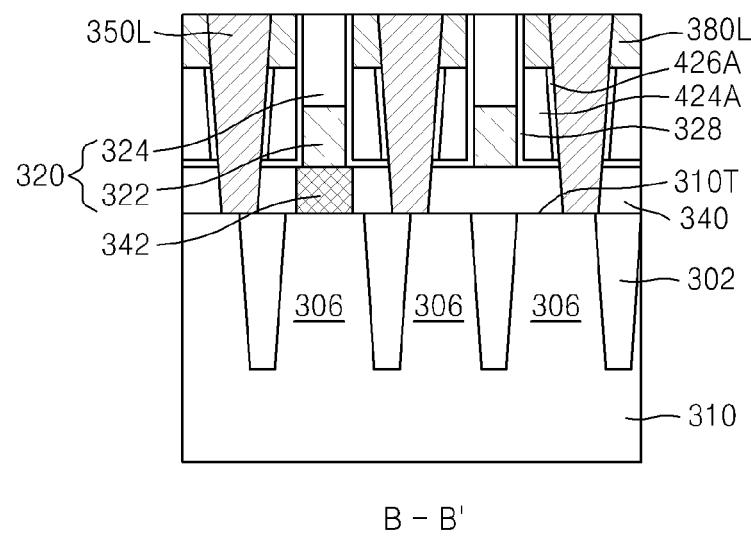
Figure 24B:
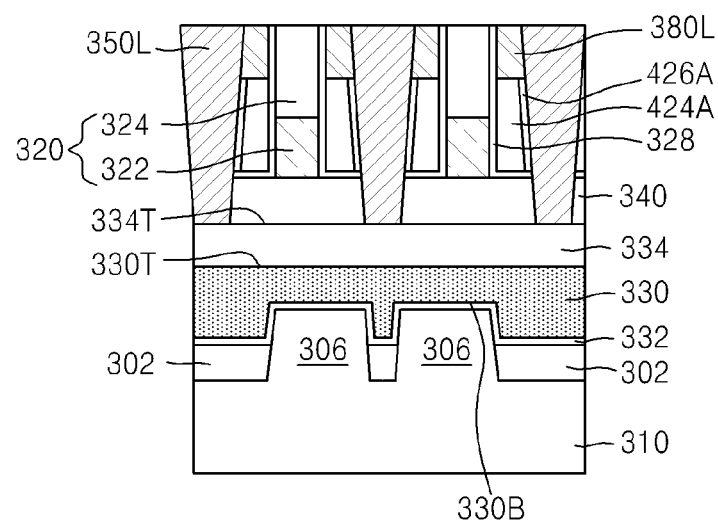

Referring to FIGS. 24A and 24B, support layers 380L are formed to respectively fill the support spaces 380S in the same manner as described with reference to FIGS. 15A and 15B.

Figure 25A:
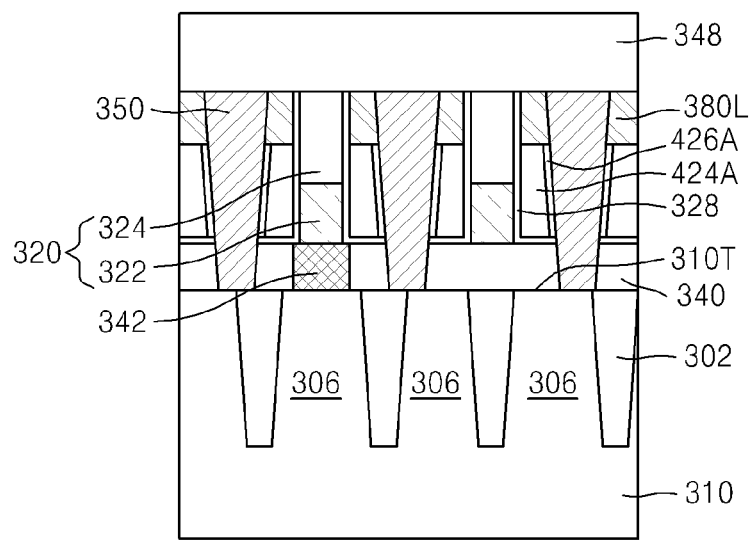
Figure 25B:
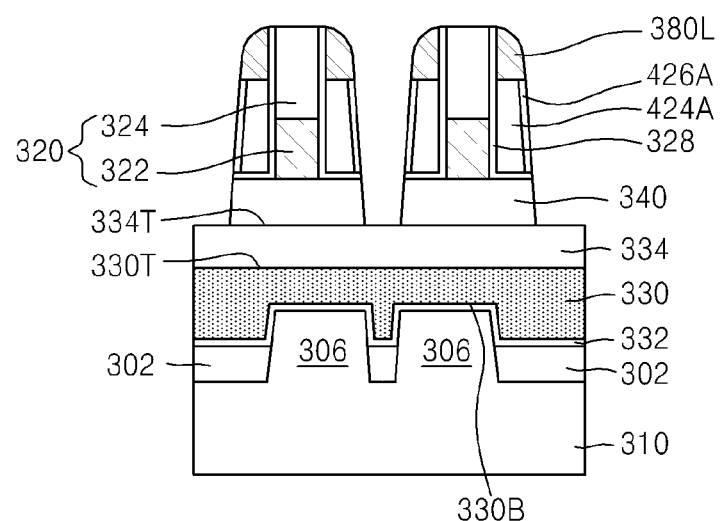

Referring to FIGS. 25A and 25B, portions of the respective contact plug layers 350L are removed using a mask pattern 348 as an etch mask in the same manner as described with reference to FIGS. 16A and 16B, thereby forming a plurality of contact plugs 350.

Figure 26A:
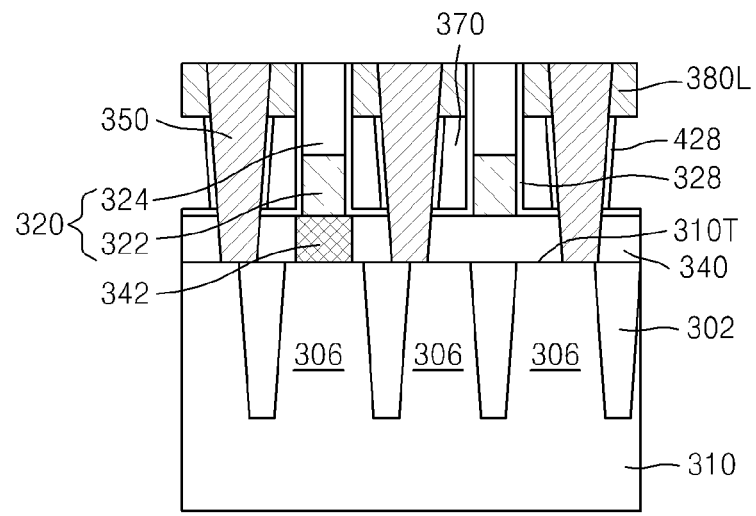
Figure 26B:
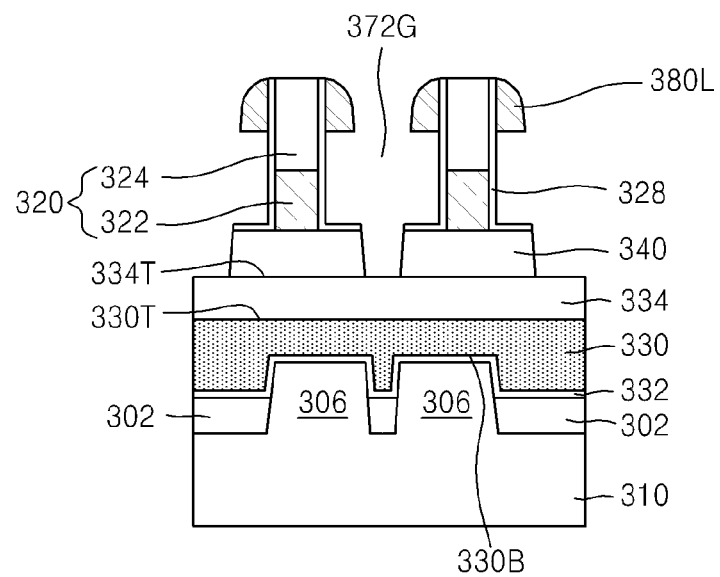

Referring to FIGS. 26A and 26B, in a manner similar to that described with reference to FIGS. 17A and 17B, the mask pattern 348 is removed, portions of the second sacrificial spacer patterns 426A exposed by gaps 372G are removed to form a plurality of insulating spacers 428, and the first sacrificial spacer patterns 424A are exposed by the gaps 372G. Thereafter, the first sacrificial spacer patterns 424A are removed (by a wet etching process) so that air spaces 370 are formed between the bit line stack structures 320 and the contact plugs 350.

The insulating liner 328 and the plurality of insulating spacers 428 are exposed by the air space 370. The insulating liner 328 and the support layers 380L are exposed by the gaps 372G, and air spaces 370 communicate with the gaps 372G.

Figure 27A:
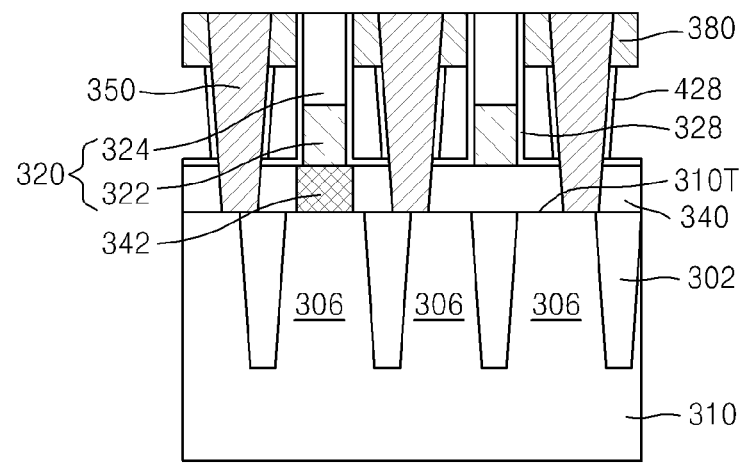
Figure 27B:
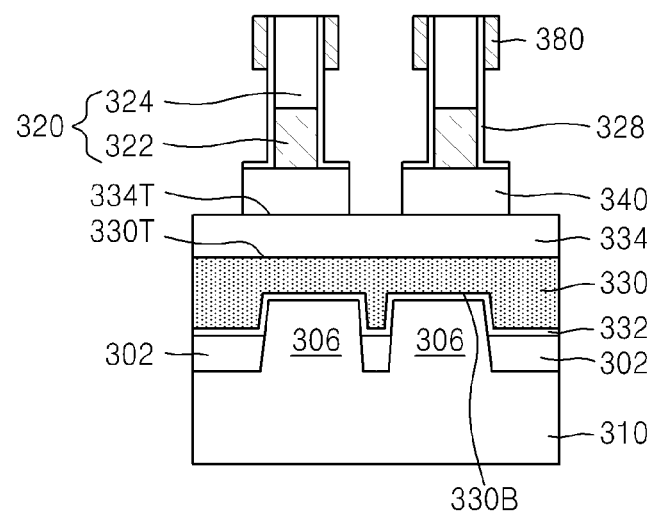

Referring to FIGS. 27A and 27B, as described with reference to FIGS. 18A and 18B, portions of the support layers 380L, exposed by the gaps 372G, are removed to reduce the width of support layers 380L (to width WS). As a result, supports 380, whose respective widths vary in the direction in which the bit line stack structures 320 extend, are formed.

Figure 28A:
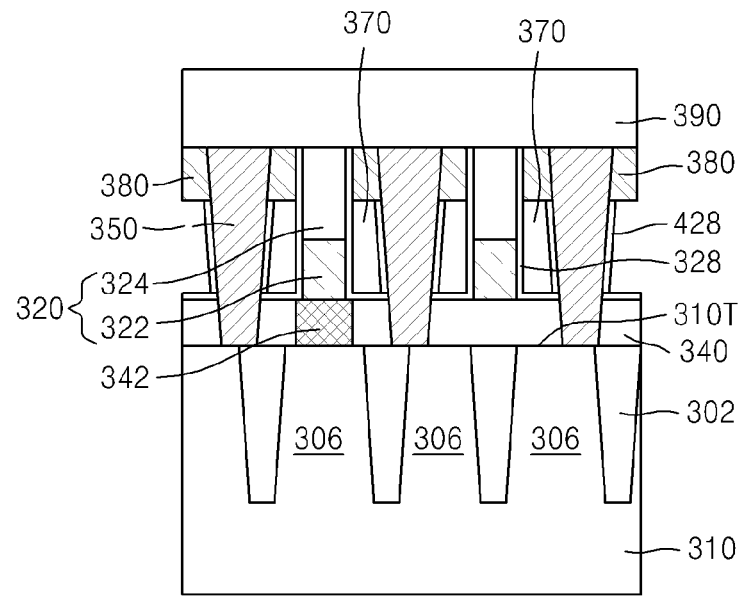
Figure 28B:
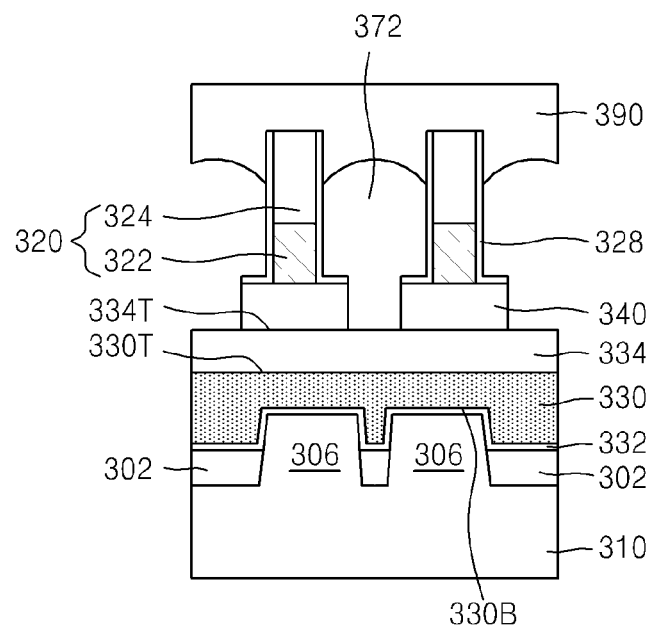

Referring to FIGS. 28A and 28B, in a manner similar to that described with reference to FIGS. 19A and 19B, a second interlayer insulating layer 390 is formed over the plurality of bit line stack structures 320, the plurality of contact plugs 350, and the plurality of supports 380.

Figure 5A:
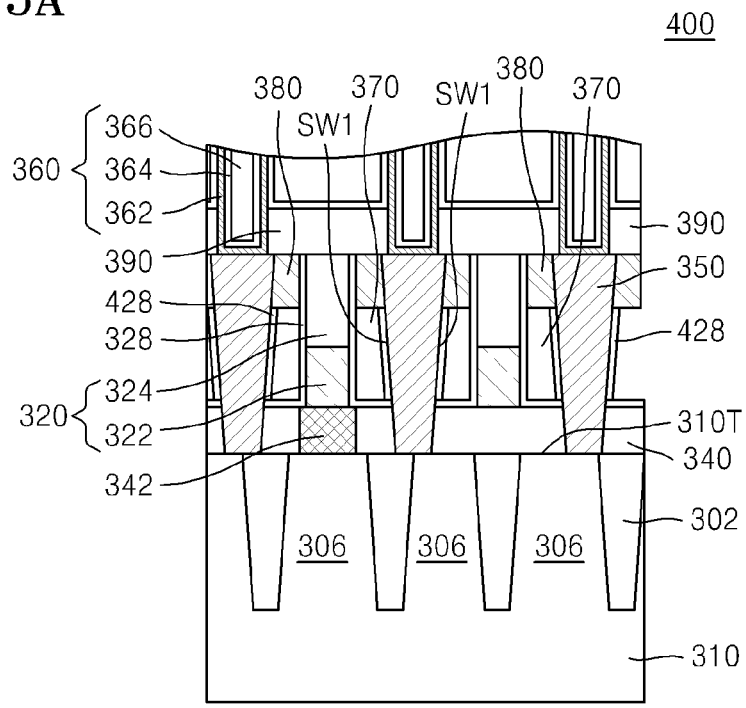
FIGS. 5A and 5B are cross-sectional views of another example of a semiconductor device according to the inventive concept.
Figure 5B:
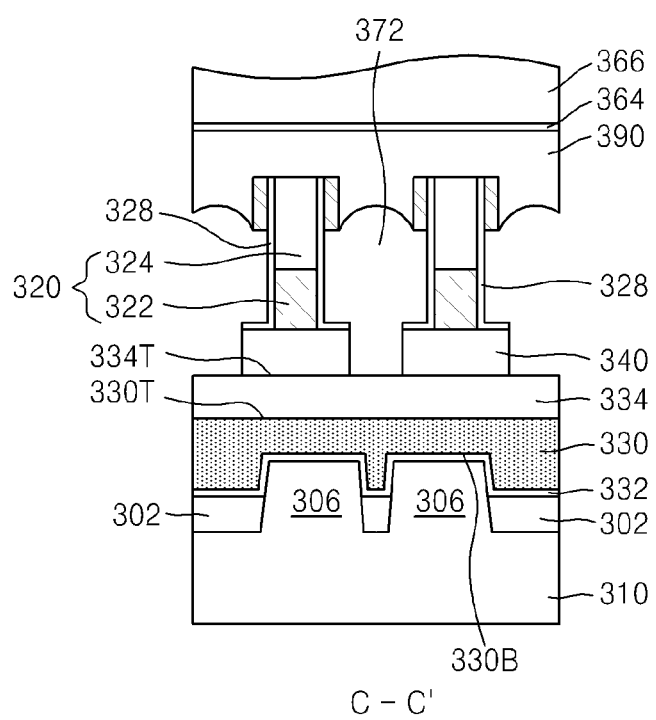

Afterwards, a plurality of capacitors 360 are formed through the second interlayer insulating layer 390, thereby completing the semiconductor device 400 shown in FIGS. 5A and 5B.

An embodiment of a method of manufacturing a semiconductor device 500, shown in and described with reference to FIGS. 6A-6D, according to the inventive concept will now be described with reference to FIGS. 29A-30B.

Figure 29A:
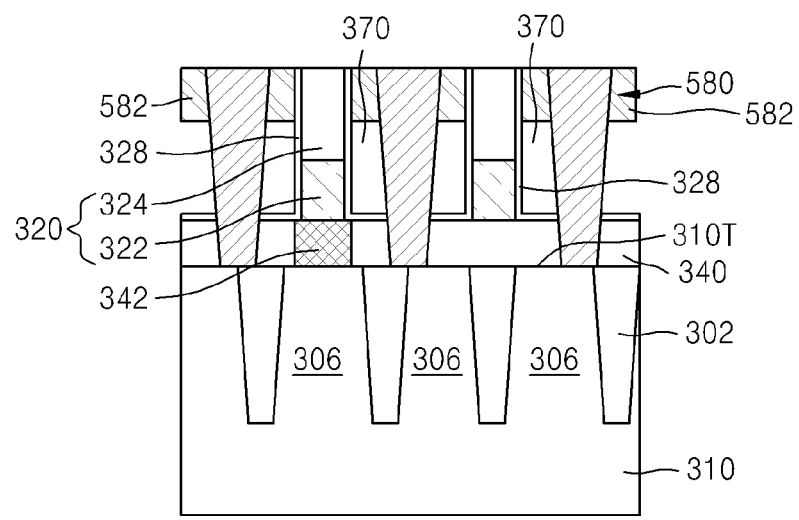
FIGS. 29A, 29B, 30A, and 30B illustrate still another example of a method of manufacturing a semiconductor device according to the inventive concept, with FIGS. 29A and 30A each being a cross-sectional view as taken in the same direction as line B-B' of FIG. 6A, and FIGS. 29B and 30B each being a cross-sectional view as taken in the same direction as line C-C' of FIG. 6A.
Figure 29B:
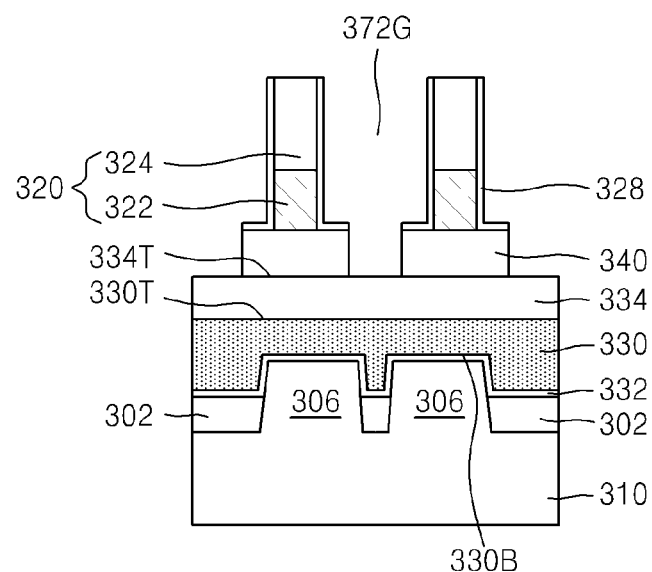

Referring to FIGS. 29A and 29B, the processes described with reference to FIGS. 10A-17B are performed to form a structure in which air space 370 is present between a plurality of bit line stack structures 320 and a plurality of contact plugs 350. Thereafter, portions of a plurality of support layers 380L (refer to FIGS. 17A and 17B), exposed by gaps 372G, are removed so that a plurality of supports 580 are formed. Each of the supports 580 is made up of a plurality of discrete support pieces 582 spaced apart from one another in a row in the longitudinal direction of the bit line stack structures 320. Also, the support 580 extends, albeit intermittently, over the entire length of the bit line stack structure 320.

Figure 30A:
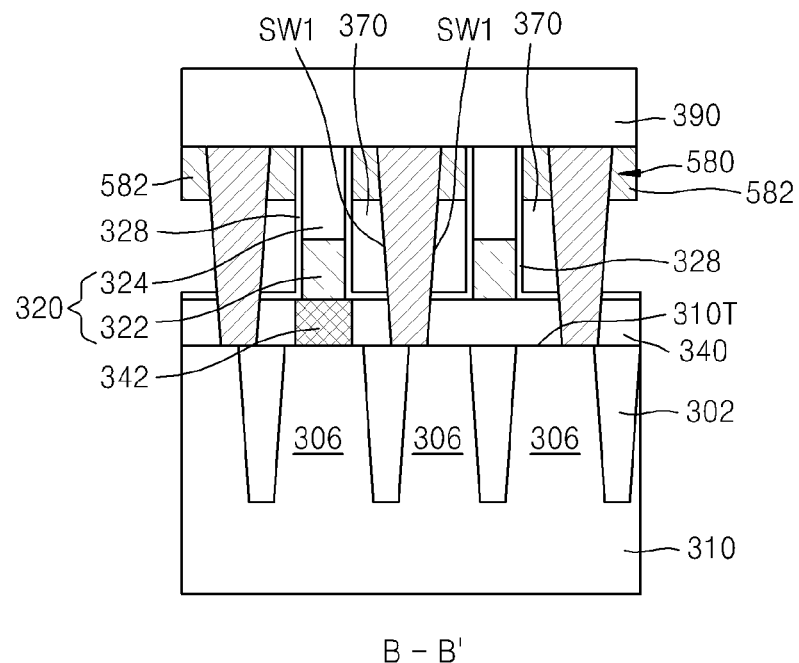
Figure 30B:
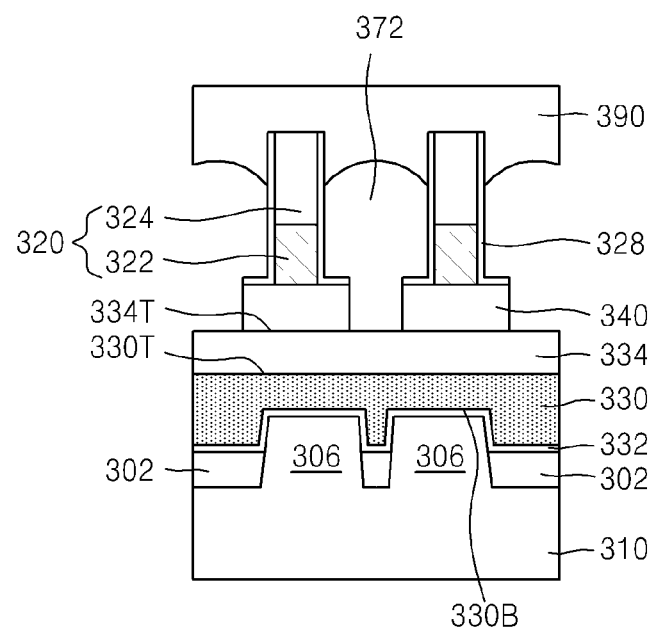

Referring to FIGS. 30A and 30B, in the same manner as described with reference to FIGS. 19A and 19B, insulating material is deposited on the substrate 310, and a second interlayer insulating layer 390 is formed over the plurality of bit line stack structures 320, the plurality of contact plugs 350, and the plurality of supports 580. In this respect, the second interlayer insulating layer 390 is formed in such a way as to not fill the gaps 372G completely.

Subsequently, a plurality of capacitors 360 are formed in the second interlayer insulating layer 390 to thereby complete the forming of the semiconductor device 500.

Another embodiment of a method of manufacturing a semiconductor device 900 according to the inventive concept will now be described with reference to FIGS. 31A-33B.

Figure 31A:
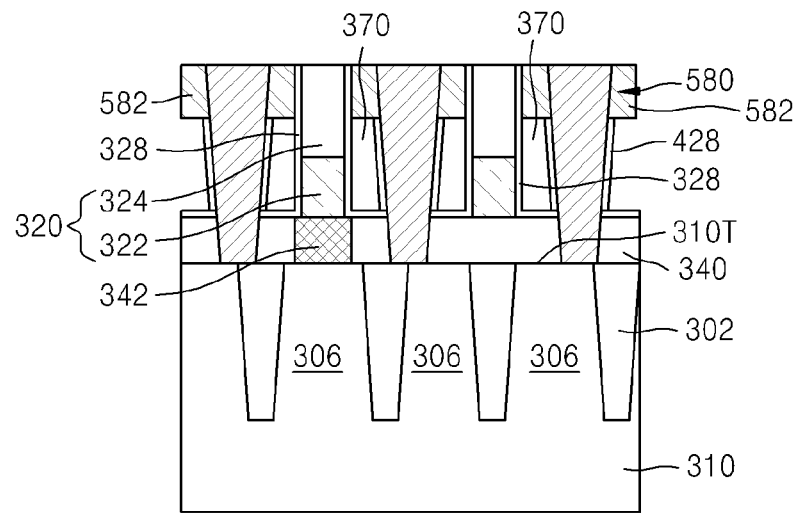
FIGS. 31A-33B illustrating still another example of a method of manufacturing a semiconductor device according to the inventive concept, with FIGS. 31A, 32A and 33A each being a cross-sectional view taken in the same direction as line B-B' of FIG. 6A, and FIGS. 31B, 32B and 33B each being a cross-sectional view taken in the same direction as line C-C' of FIG. 6A.
Figure 31B:
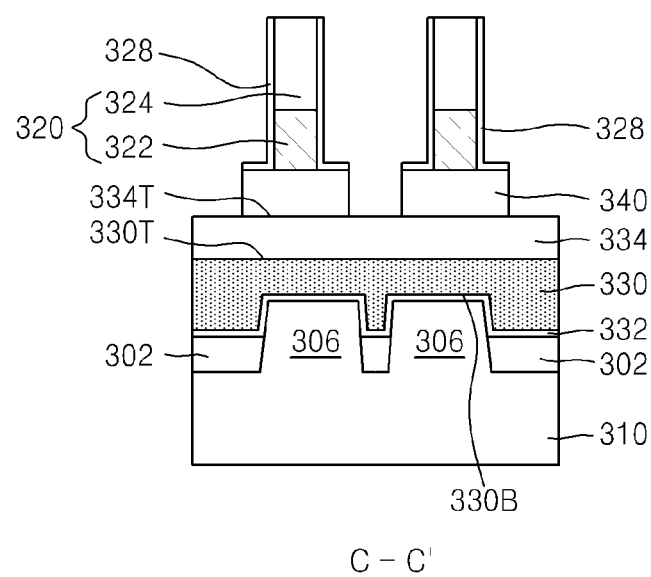

Referring to FIGS. 31A and 31B, the processes described with reference to FIGS. 20A through 26A and 20B through 26B are performed to form a structure in which air space 370 is present between a plurality of bit line stack structures 320 and a plurality of contact plugs 350. After that, portions of support layers 380L (refer to FIGS. 26A and 26B), exposed by a pair of gaps 372G, are removed so that a plurality of supports 580 are formed. Each of the supports 580 is made up of a plurality of discrete support pieces 582 spaced apart from one another and arranged in a row along the lengthwise direction of the bit line stack structure 320. Also, each support 580 may extend, albeit intermittently, over the entire length of the bit line stack structure 320.

Portions of sidewalls of the contact plugs 350, which face the air space 370, are covered with insulating spacers 428, and the insulating spacers 428 and insulating liners 328 are exposed by the air spaces 370.

Figure 32A:
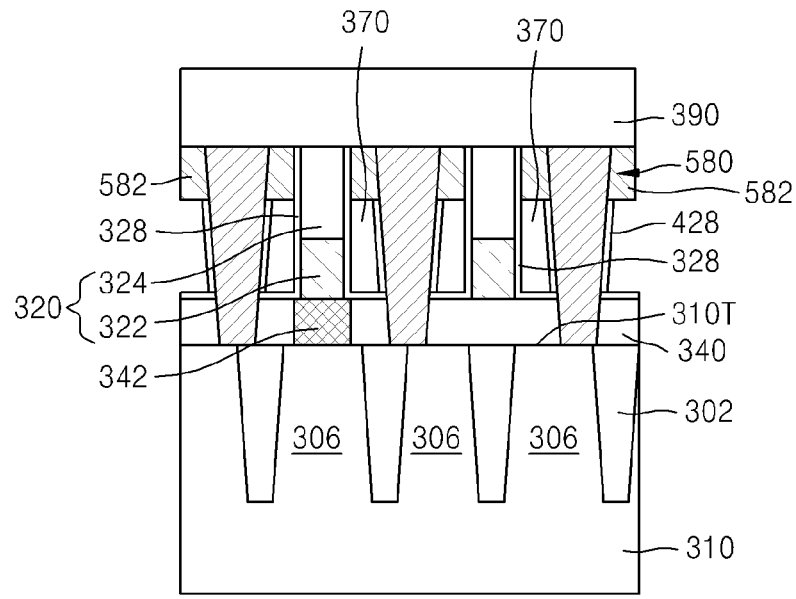
Figure 32B:
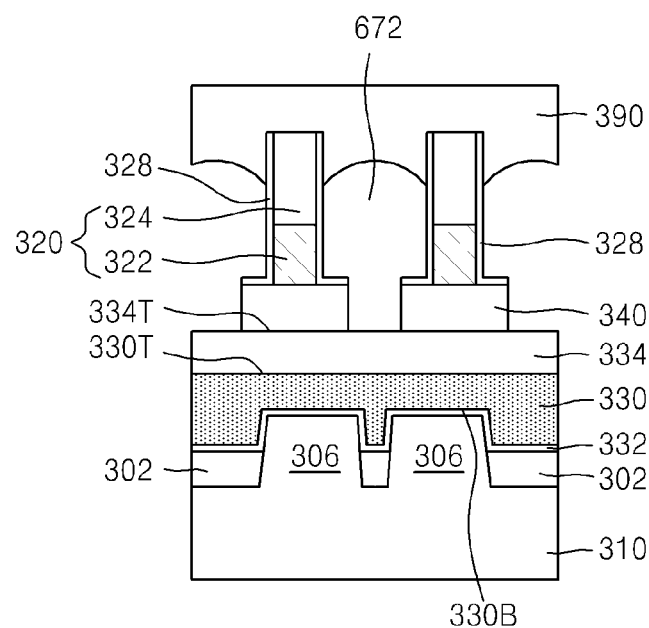

Referring to FIGS. 32A and 32B, in the same manner as described with reference to FIGS. 28A and 28B, insulating material is deposited on the substrate 310, and a second interlayer insulating layer 390 is formed over the plurality of bit line stack structures 320, the plurality of contact plugs 350, and the plurality of supports 580. In this respect, the second interlayer insulating layer 390 does not fill the gaps 372G completely.

Figure 33A:
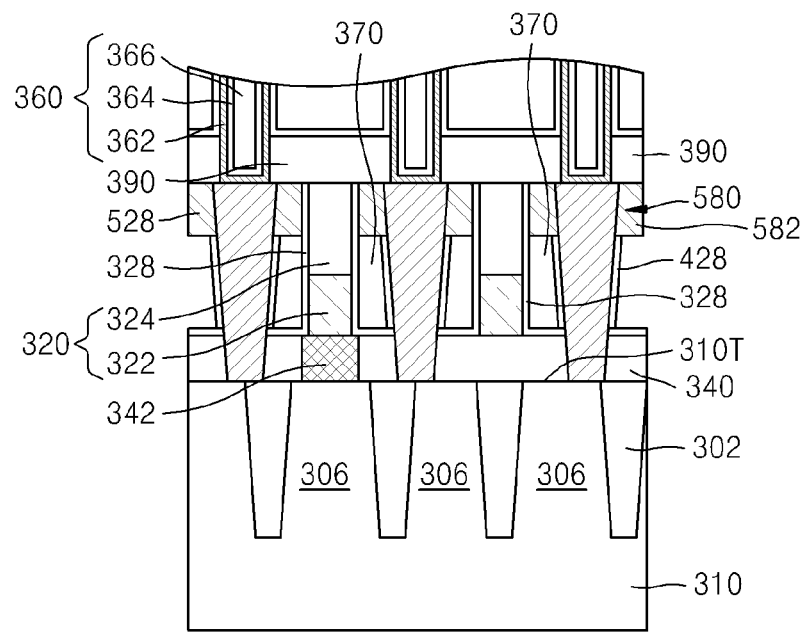
Figure 33B:
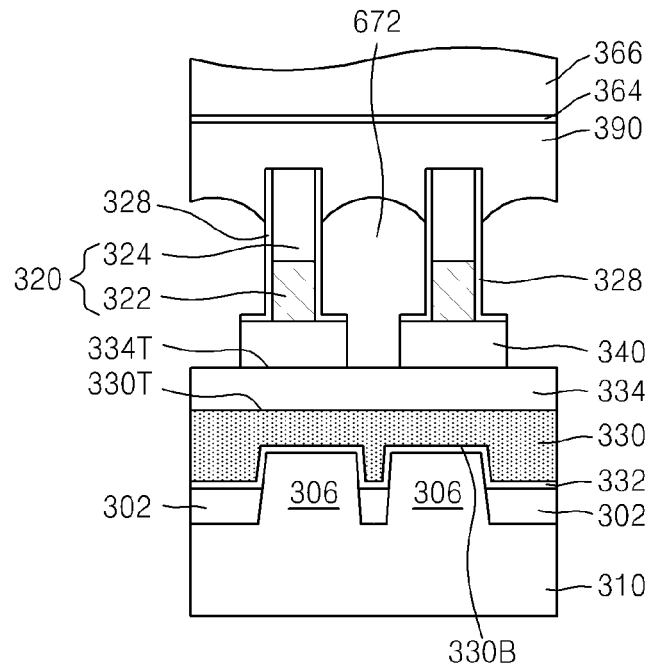

Referring to FIGS. 33A and 33B, a plurality of capacitors 360 are formed in the second interlayer insulating layer 390, thereby completing the semiconductor device 900.

Figure 34:
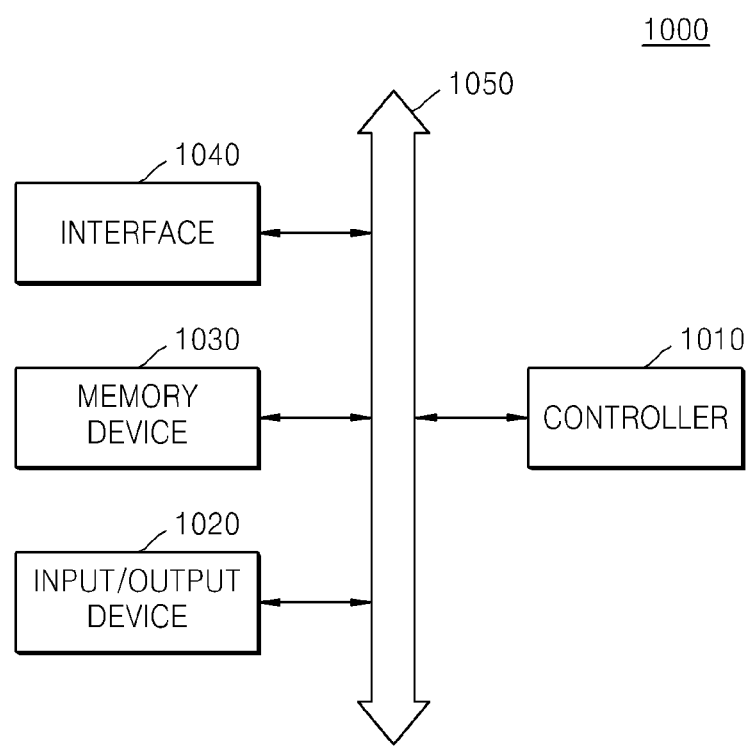
FIG. 34 is a block diagram of an example of a system including a semiconductor device, according to the inventive concept.

FIG. 34 illustrates an example of a system 1000 including a semiconductor device, according to the inventive concept.

The system 1000 of this example includes a controller 1010, an input/output (I/O) device 1020, a memory device 1030, and an interface 1040. The system 1000 may be a mobile system or other system configured to transmit or receive information. Examples of a mobile system include a personal digital assistant (PDA), a portable computer such as a web tablet, a wireless or mobile phone, a digital music player, or a memory card. The system 1000 may be employed specifically by a media player 3 (MP3) player, a navigation system, a portable multimedia player (PMP), a solid-state disk (SSD), or a household appliance.

To any of these ends, the controller 1010 may be configured to control an execution program in the system 1000. The controller 1010 may include a microprocessor (MP), a digital signal processor (DSP), a microcontroller (MC), or the like. The I/O device 1020 is used to input or output data to or from the system 1000. The system 1000 may be connected to an external device (e.g., a personal computer (PC) or network) using the I/O device 1020 and exchange data with the external device. The I/O device 1020 may be a keypad, a keyboard, or a display device.

The memory device 1030 may store codes and/or data required for operations of the controller 1010 or store data processed by the controller 1010. The memory device 1030 may include a semiconductor device having a fin field effect transistor (FinFET). The memory device 1030 may include a semiconductor device, such as any of the devices 100, 200, 300, 400, 500, 600, 700, 800, and 900, according to the inventive concept.

The interface 1040 provides a data transmission path between the system 1000 and other external devices. The controller 1010, the I/O device 1020, the memory device 1030, and the interface 1040 may communicate with one another through a bus 1050.

While the inventive concept has been particularly shown and described with reference to the preferred embodiments thereof, it will be understood that various changes in form and details may be made therein without departing from the spirit and scope of the following claims.

What is claimed is:

1. A semiconductor device comprising:
a substrate;
   a linear stack structure disposed on the substrate and extending longitudinally in a first direction on the substrate, the first direction being parallel to a top surface of the substrate,
   the stack structure including a conductive line extending longitudinally in the first direction, and an insulating capping line disposed on an upwardly facing top surface of the conductive line and extending longitudinally in the first direction;
   a row of contact plugs spaced from each other in the first direction, the contact plugs each having first and second sidewall surfaces, the first sidewall surfaces of the contact plugs facing one side of the conductive line with air spaces between the first sidewall surfaces and the conductive line, respectively, the second sidewall surface of each of the contact plugs facing a said second sidewall surface of another of the contact plugs in the row with air gaps extending in the first direction between adjacent ones of the second sidewall surfaces in the row;
   a support interposed between one side of the insulating capping line and the row of contact plugs and topping the air spaces, the width of the support in a second direction orthogonal to the first direction and parallel to the upper surface of the substrate varying along the first direction or the support being discontinuous in the first direction; and
   an interlayer insulating layer disposed on the stack structure, the interlayer insulating layer having a bottom surface extending contiguously across an upwardly facing top surface of the insulating capping line and into regions between upper portions of adjacent ones of the contact plugs in the row,
   wherein the bottom surface of the interlayer insulating layer extends in said regions below the level of the upwardly facing top surface of the insulating capping line,
   the bottom surface of the interlayer insulating layer tops and is exposed by the air gaps, and
   the air gaps, mid-way between the adjacent ones of the second sidewall surfaces of the contact plugs in the row, are confined below the level of upwardly facing top surfaces of the contact plugs.

2. The device of claim 1, wherein the support has a first support portion facing the first sidewall surfaces of the contact plugs and a second support portion that is offset from the first sidewall surfaces in the first direction so as to not face the sidewall surfaces, and
   the width of the second support portion in the second direction is smaller than the width of the first support portion in the second direction.

3. The device of claim 2, wherein the support includes a plurality of first support portions which are spaced from each other at regular intervals along the first direction, and face the first sidewall surfaces of the contact plugs, respectively.

4. The device of claim 2, wherein the second support portion of the support has one sidewall surface disposed in said regions between upper portions of the contact plugs, and another sidewall surface that faces the capping line,
   the bottom surface of the interlayer insulating layer covers said one sidewall surface of the second support portion, and an uppermost boundary of each of the air gaps is located below the level of upwardly facing top surfaces of the contact plugs and above the level of a downwardly facing bottom surface of the second support portion.

5. The device of claim 2, wherein the support is a single layer of material selected from the group consisting of SiCN, SiOC, SiON, SiOCN, and metal oxides.

6. The device of claim 1, wherein the support extends continuously in the first direction over the entire length of the stack structure.

7. The device of claim 1, wherein the support is discontinuous in the first direction over the entire length of the stack structure.

8. The device of claim 1, further comprising an insulating liner interposed between the insulating capping line and the support, the insulating liner covering sides of the conductive line.

9. The device of claim 1, further comprising insulating spacers covering the first sidewall surfaces of the contact plugs, and wherein the insulating spacers are exposed.

10. The device of claim 1, wherein the first and second sidewall surfaces of the contact plugs are exposed.

11. The device of claim 1, wherein the support includes at least one material selected from the group consisting of silicon nitride (SiN), silicon carbon nitride (SiCN), silicon oxide carbide (SiOC), silicon oxynitride (SiON), silicon oxide carbon nitride (SiOCN), titanium oxide (TiO), tantalum oxide (TaO), tantalum titanium oxide (TaTiO), tantalum silicon oxide (TaSiO), and aluminum oxide (AlO).

12. The device of claim 1, wherein the support has a multilayered structure including a plurality of support layers of different materials.

13. The device of claim 1, wherein an uppermost boundary of each of the air gaps is located below the level of upwardly facing top surfaces of the contact plugs and above the level of the upwardly facing top surface of the conductive line of the stack structure.

14. The device of claim 1, wherein no part of the support is interposed in the first direction between the contact plugs adjacent one another in the row.

15. A semiconductor device comprising:
a substrate having a plurality of active regions;
a linear stack structure including a bit line and an insulating capping line disposed on an upwardly facing surface of the bit line, and wherein the stack structure extends longitudinally on the substrate across the plurality of active regions in a first direction parallel to a top surface of the substrate;
contact plugs each contacting one of the active regions and each having first and second sidewall surfaces, the first sidewall surfaces of the contact plugs facing the bit line with air spaces between the first sidewall surfaces and the bit line, respectively, the second sidewall surface of each of the contact plugs facing a said second sidewall surface of another of the contact plugs with air gaps extending in the first direction between adjacent ones of the second sidewall surfaces of the contact plugs;
a support having a bottom surface and opposite sidewall surfaces, the bottom surface topping and exposed by the air spaces, one of the opposite sidewall surfaces facing the insulating capping line and the other of the opposite sidewall surfaces facing the contact plugs, the width of the support in a second direction orthogonal to the first direction and parallel to the top surface of the substrate varying along the first direction or the support is discontinuous in the first direction; and an interlayer insulating layer disposed on the stack structure, the interlayer insulating layer having a bottom surface extending contiguously across an upwardly facing top surface of the insulating capping line and into regions between upper portions of the contact plugs,
wherein the bottom surface of the interlayer insulating layer extends in said regions below the level of the upwardly facing top surface of the insulating capping line,
the bottom surface of the interlayer insulating layer tops and is exposed by the air gaps, and
the air gaps, mid-way between the adjacent ones of the second sidewall surfaces of the contact plugs in the row, are confined below the level of upwardly facing top surfaces of the contact plugs.

16. The device of claim 15, further comprising a word line buried in the substrate, the word line extending in a direction different from the first direction.

17. The device of claim 15, wherein the air space is disposed entirely above the substrate and at least an insulating liner is interposed between the air space and the substrate.

18. The device of claim 15, wherein an uppermost boundary of each of the air gaps is located below the level of upwardly facing top surfaces of the contact plugs and above the level of the upwardly facing top surface of the bit line of the stack structure.

19. The device of claim 15, wherein the contact plugs are disposed in a row as spaced from each other in the first direction, and
no part of the support is interposed in the first direction between the contact plugs adjacent one another in the row.

20. A semiconductor device comprising:
a substrate having active regions;
bit lines disposed on the substrate and extending parallel to each other in a first direction, the bit lines being electrically connected to the active regions;
a respective row of contact plugs interposed between adjacent ones of the bit lines of each respective pair thereof,
each of the contact plugs having an upwardly facing top surface and opposite sidewall surfaces facing the bit lines between which the contact plug is disposed with air spaces existing between the sidewall surfaces and the bit lines, respectively, and each of the contact plugs being electrically connected to one of the active regions of the substrate;
capacitors disposed on and electrically connected to the contact plugs such that the contact plugs electrically connect the capacitors to the active regions of the substrate; and
supports that support upper portions of the contact plugs and top the air spaces, and
wherein air gaps are present between the contact plugs in the row thereof such that each of the air gaps extends in the first direction between adjacent ones of a respective pair of the contact plugs, the air gaps being open to the air spaces between the sidewall surfaces of the contact plugs of the row and the bit lines between which the contact plugs are disposed; and
an interlayer insulating layer disposed on the bit lines, the interlayer insulating layer having a bottom surface extending into regions between upper portions of the contact plugs, wherein the bottom surface of the interlayer insulating layer tops and is exposed by the air gaps, and the air gaps are confined, by the bottom surface of the interlayer insulating layer, below the top surfaces of the contact plugs at locations in the device mid-way between adjacent ones of the contact plugs of the row.

* * * * *